US009821523B2

(12) United States Patent
van Heerbeek et al.

(10) Patent No.: US 9,821,523 B2
(45) Date of Patent: Nov. 21, 2017

(54) LIGHT EMITTING DIODE DEVICES, METHOD OF MANUFACTURE, USES THEREOF

(71) Applicant: SABIC Innovative Plastics IP B.V., Bergen op Zoom (NL)

(72) Inventors: Hendrikus Petrus Cornelis van Heerbeek, Bergen op Zoom (NL); Frank Huijs, Breda (NL); Johannes de Brouwer, Oisterwijk (NL); Christopher Luke Hein, Evansville, IN (US)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 827 days.

(21) Appl. No.: 14/063,042

(22) Filed: Oct. 25, 2013

(65) Prior Publication Data

US 2014/0117393 A1 May 1, 2014

Related U.S. Application Data

(60) Provisional application No. 61/718,400, filed on Oct. 25, 2012.

(51) Int. Cl.
*C08L 69/00* (2006.01)
*C08K 5/357* (2006.01)
(Continued)

(52) U.S. Cl.
CPC .......... *B29D 11/0074* (2013.01); *C08K 5/357* (2013.01); *H01L 33/56* (2013.01); *H01L 33/501* (2013.01)

(58) Field of Classification Search
CPC ...................................................... H01L 33/52
See application file for complete search history.

(56) References Cited

U.S. PATENT DOCUMENTS

| 489,803 A | 1/1893 | Gillespie et al. |
| 825,010 A | 7/1906 | Snow et al. |
| (Continued) |

FOREIGN PATENT DOCUMENTS

| CN | 1204664 A | 1/1999 |
| CN | 1853118 A | 10/2006 |
| (Continued) |

OTHER PUBLICATIONS

International Search Report for International Application No. PCT/US2013/066855, International Application Filing Date Oct. 25, 2013, dated Feb. 4, 2014, 4 pages.

(Continued)

*Primary Examiner* — Randy Gulakowski
*Assistant Examiner* — Ha S Nguyen
(74) *Attorney, Agent, or Firm* — Cantor Colburn LLP

(57) ABSTRACT

A light emitting diode lighting device contains a light emitting diode and a lighting device component, wherein the device component comprises a polycarbonate composition comprising a bisphenol A polycarbonate; and 2,2'-(1,4-phenylene)bis(4H-3,1-benzoxazin-4-one) in an amount effective to provide a composition wherein a molded sample of the composition has a UL94 rating of V-2 or better at a thickness of 0.9 mm; an absorbance of less than 2 a.u. in the region of 370 to 380 nanometers; and an increase in yellowness index ($\Delta YI$) of 12 or less at 2.5 mm thickness after heat aging at 130° C. for 5,000 hours.

35 Claims, 3 Drawing Sheets

(51) Int. Cl.
 *B29D 11/00* (2006.01)
 *H01L 33/56* (2010.01)
 *H01L 33/50* (2010.01)

(56) References Cited

U.S. PATENT DOCUMENTS

| | | | |
|---|---|---|---|
| 3,049,568 A | 8/1962 | Apel et al. |
| 3,394,089 A | 7/1968 | McNutt et al. |
| 3,673,262 A | 6/1972 | Prahl et al. |
| 3,839,247 A | 10/1974 | Bialous et al. |
| 4,045,379 A | 8/1977 | Kwantes et al. |
| 4,052,466 A | 10/1977 | Sun |
| 4,076,686 A | 2/1978 | Calkins |
| 4,191,843 A | 3/1980 | Kwantes et al. |
| 4,294,995 A | 10/1981 | Faler et al. |
| 4,308,404 A | 12/1981 | Kwantes et al. |
| 4,308,405 A | 12/1981 | Kwantes |
| 4,346,247 A | 8/1982 | Faler et al. |
| 4,365,099 A | 12/1982 | Faler et al. |
| 4,391,997 A | 7/1983 | Mendiratta |
| 4,396,728 A | 8/1983 | Faler |
| 4,400,555 A | 8/1983 | Mendiratta |
| 4,423,252 A | 12/1983 | Maki et al. |
| 4,424,283 A | 1/1984 | Faler et al. |
| 4,455,409 A | 6/1984 | Faler et al. |
| 4,478,956 A | 10/1984 | Maki et al. |
| 4,584,416 A | 4/1986 | Pressman et al. |
| 4,590,303 A | 5/1986 | Mendiratta |
| 4,595,704 A | 6/1986 | Fazio |
| 4,819,245 A | 4/1989 | Marimoto et al. |
| 4,820,740 A | 4/1989 | Li |
| 4,822,923 A | 4/1989 | Li |
| 4,904,710 A * | 2/1990 | Nace .................... C08K 5/06 |
| | | | 522/163 |
| 4,918,245 A | 4/1990 | Iimuro et al. |
| 5,015,784 A | 5/1991 | Rudolph et al. |
| 5,064,885 A | 11/1991 | Muller et al. |
| 5,087,767 A | 2/1992 | Okamoto et al. |
| 5,212,206 A | 5/1993 | Rudolph et al. |
| 5,233,096 A | 8/1993 | Lundquist |
| 5,284,981 A | 2/1994 | Rudolph et al. |
| 5,288,926 A | 2/1994 | Patrascu et al. |
| 5,302,774 A | 4/1994 | Berg et al. |
| 5,364,895 A | 11/1994 | Stevenson et al. |
| 5,395,857 A | 3/1995 | Berg et al. |
| 5,414,151 A | 5/1995 | Pressman et al. |
| 5,414,152 A | 5/1995 | Cipullo |
| 5,424,006 A | 6/1995 | Murayama et al. |
| 5,438,086 A | 8/1995 | Stevenson et al. |
| 5,455,282 A | 10/1995 | Berg et al. |
| 5,463,140 A | 10/1995 | Wehmeyer et al. |
| 5,470,938 A | 11/1995 | Sakashita et al. |
| 5,475,154 A | 12/1995 | Lundquist et al. |
| 5,502,153 A | 3/1996 | Sakashita et al. |
| 5,530,062 A | 6/1996 | Bradtke et al. |
| 5,589,517 A | 12/1996 | Sugawara et al. |
| 5,606,007 A | 2/1997 | Sakashita et al. |
| 5,631,338 A | 5/1997 | Inoue et al. |
| 5,672,664 A | 9/1997 | Derudder et al. |
| 5,698,600 A | 12/1997 | Wulff et al. |
| 5,747,632 A | 5/1998 | Adachi et al. |
| 5,780,690 A | 7/1998 | Berg et al. |
| 5,783,733 A | 7/1998 | Kissinger |
| 5,837,757 A | 11/1998 | Nodera et al. |
| 5,883,218 A | 3/1999 | Gordon et al. |
| 5,914,431 A | 6/1999 | Fennhoff |
| 5,939,494 A | 8/1999 | Wehmeyer et al. |
| 6,066,861 A | 5/2000 | Hohn et al. |
| 6,069,225 A | 5/2000 | Gerace et al. |
| 6,074,742 A | 6/2000 | Smith et al. |
| 6,133,190 A | 10/2000 | Wehmeyer et al. |
| 6,174,987 B1 | 1/2001 | Gordon et al. |
| 6,211,417 B1 | 4/2001 | Fengler et al. |
| 6,329,556 B1 | 12/2001 | Sakura et al. |
| 6,355,946 B1 | 3/2002 | Ishinaga |
| 6,373,262 B1 | 4/2002 | Herring et al. |
| 6,414,199 B1 | 7/2002 | Saruwatari |
| 6,429,343 B1 | 8/2002 | Iwahara |
| 6,429,373 B1 | 8/2002 | Scrimpshire et al. |
| 6,486,222 B2 | 11/2002 | Kissinger et al. |
| 6,586,637 B2 | 7/2003 | Iwahara |
| 6,613,823 B1 | 9/2003 | Battiste et al. |
| 6,653,513 B1 | 11/2003 | Iwahara |
| 6,653,613 B1 | 11/2003 | Bucourt et al. |
| 6,664,313 B2 | 12/2003 | Hirai et al. |
| 6,692,659 B2 * | 2/2004 | Brown .................... C08J 3/226 |
| | | | 252/301.36 |
| 6,706,846 B2 | 3/2004 | Brack et al. |
| 6,710,211 B1 | 3/2004 | Heydenreich et al. |
| 6,727,394 B2 | 4/2004 | Saruwatari |
| 6,730,816 B2 | 5/2004 | Lundquist |
| 6,740,784 B2 | 5/2004 | Iwahara et al. |
| 6,995,294 B2 | 2/2006 | Webb et al. |
| 7,112,702 B2 | 9/2006 | Carvill et al. |
| 7,112,703 B2 | 9/2006 | Neumann et al. |
| 7,129,382 B2 | 10/2006 | Iwahara et al. |
| 7,148,313 B2 | 12/2006 | Koga et al. |
| 7,227,046 B2 | 6/2007 | Commarieu |
| 7,253,223 B2 | 8/2007 | Kawato et al. |
| 7,491,837 B2 | 2/2009 | Schlosberg et al. |
| 7,700,696 B2 * | 4/2010 | van de Grampel ..... C08L 69/00 |
| | | | 525/439 |
| 7,852,428 B2 | 12/2010 | Byoun et al. |
| 7,879,927 B2 | 2/2011 | Vlottes et al. |
| 7,923,586 B2 | 4/2011 | Stahlbush et al. |
| 7,939,591 B2 | 5/2011 | Tomoda |
| 7,959,827 B2 | 6/2011 | Comanzo et al. |
| 7,964,273 B2 | 6/2011 | Kogure et al. |
| 7,989,531 B2 | 8/2011 | Bersted et al. |
| 8,075,984 B2 | 12/2011 | Horio et al. |
| 8,250,101 B2 | 8/2012 | Fot et al. |
| 8,735,634 B2 | 5/2014 | Hasyagar et al. |
| 9,006,378 B2 | 4/2015 | Van Den Bogerd et al. |
| 9,090,759 B2 | 7/2015 | Flores et al. |
| 9,553,244 B2 | 1/2017 | Morizur et al. |
| 2002/0115762 A1 | 8/2002 | Chung et al. |
| 2002/0147256 A1 | 10/2002 | Eckel et al. |
| 2003/0180542 A1 | 9/2003 | Pickett et al. |
| 2003/0232957 A1 | 12/2003 | Silvi et al. |
| 2004/0024105 A1 | 2/2004 | Kim et al. |
| 2004/0077820 A1 | 4/2004 | Silva et al. |
| 2004/0116751 A1 | 6/2004 | Carvill et al. |
| 2004/0181100 A1 | 9/2004 | Lundquist |
| 2004/0227465 A1 | 11/2004 | Menkara et al. |
| 2005/0070615 A1 | 3/2005 | Terajima et al. |
| 2005/0113534 A1 | 5/2005 | Agarwal et al. |
| 2005/0177007 A1 | 8/2005 | Neumann et al. |
| 2005/0209434 A1 | 9/2005 | Abad et al. |
| 2005/0215833 A1 | 9/2005 | Neumann et al. |
| 2005/0261414 A1 | 11/2005 | Mitsuhashi et al. |
| 2005/0272857 A1 | 12/2005 | Kawato et al. |
| 2006/0047037 A1 | 3/2006 | Kawato et al. |
| 2006/0134366 A1 | 6/2006 | Haese et al. |
| 2006/0135690 A1 | 6/2006 | Juikar et al. |
| 2006/0159926 A1 | 7/2006 | Funaki et al. |
| 2006/0243947 A1 | 11/2006 | Tsumura et al. |
| 2006/0247356 A1* | 11/2006 | Agarwal ................. C08L 69/00 |
| | | | 524/451 |
| 2006/0263545 A1 | 11/2006 | Coenjarts et al. |
| 2006/0263547 A1 | 11/2006 | Cojocariu et al. |
| 2007/0004941 A1 | 1/2007 | Blaschke et al. |
| 2007/0054110 A1 | 3/2007 | Kawato et al. |
| 2007/0139949 A1 | 6/2007 | Tanda et al. |
| 2007/0299169 A1* | 12/2007 | Ohira .................... C08J 3/226 |
| | | | 524/100 |
| 2008/0029720 A1* | 2/2008 | Li .................... C09K 11/0883 |
| | | | 250/581 |
| 2008/0081855 A1 | 4/2008 | Mullen |
| 2008/0113117 A1 | 5/2008 | Coenjarts et al. |
| 2008/0132614 A1 | 6/2008 | Jung et al. |
| 2009/0021141 A1 | 1/2009 | Emoto et al. |
| 2009/0043053 A1 | 2/2009 | Gorny et al. |
| 2009/0054586 A1 | 2/2009 | Hein et al. |
| 2009/0118406 A1 | 5/2009 | Tomoda |

(56) References Cited

U.S. PATENT DOCUMENTS

| | | | |
|---|---|---|---|
| 2010/0137549 A1 | 6/2010 | Takahashi et al. | |
| 2010/0155758 A1 | 6/2010 | Kumei et al. | |
| 2010/0164367 A1 | 7/2010 | Shioi et al. | |
| 2010/0200874 A1 | 8/2010 | Shioi et al. | |
| 2010/0261828 A1* | 10/2010 | Tomoda | C08L 69/00 524/449 |
| 2011/0127904 A1 | 6/2011 | Tsai | |
| 2011/0140593 A1 | 6/2011 | Negley et al. | |
| 2011/0151262 A1 | 6/2011 | Heuer et al. | |
| 2011/0278614 A1 | 11/2011 | Maier-Richter et al. | |
| 2012/0043552 A1 | 2/2012 | David et al. | |
| 2012/0119234 A1 | 5/2012 | Shioi et al. | |
| 2012/0131835 A1 | 5/2012 | Barrett et al. | |
| 2012/0181482 A1 | 7/2012 | Xiao et al. | |
| 2012/0248102 A1 | 10/2012 | Van De Wetering et al. | |
| 2012/0283485 A1 | 11/2012 | Hasyagar et al. | |
| 2012/0294914 A1 | 11/2012 | Tooley et al. | |
| 2013/0221837 A1 | 1/2013 | De Brouwer et al. | |
| 2013/0094179 A1 | 4/2013 | Dai et al. | |
| 2013/0108820 A1 | 5/2013 | Belfadhel et al. | |
| 2013/0200415 A1 | 8/2013 | Evans et al. | |
| 2013/0265771 A1 | 10/2013 | Flores et al. | |
| 2013/0270591 A1 | 10/2013 | De Brouwer et al. | |
| 2013/0274391 A1 | 10/2013 | An et al. | |
| 2014/0051802 A1 | 2/2014 | De Brouwer et al. | |
| 2014/0051803 A1 | 2/2014 | De Brouwer et al. | |
| 2014/0192538 A1 | 7/2014 | Berix et al. | |
| 2014/0226342 A1 | 8/2014 | Flores et al. | |
| 2014/0339586 A1 | 11/2014 | Morizur et al. | |
| 2015/0070933 A1 | 3/2015 | Van Den Bogerd et al. | |
| 2015/0267059 A1 | 9/2015 | Flores et al. | |
| 2015/0318450 A1 | 11/2015 | De Brouwer et al. | |
| 2017/0025587 A1 | 1/2017 | Evans et al. | |

FOREIGN PATENT DOCUMENTS

| | | |
|---|---|---|
| CN | 101104803 A | 1/2008 |
| CN | 101205358 A | 6/2008 |
| CN | 101325238 A | 12/2008 |
| CN | 101358133 A | 2/2009 |
| CN | 101885907 A | 11/2010 |
| CN | 102134383 A | 7/2011 |
| DE | 19503470 A1 | 8/1996 |
| DE | 102006016548 A1 | 10/2006 |
| EP | 0320658 A1 | 6/1989 |
| EP | 0475893 A1 | 3/1992 |
| EP | 0313165 B1 | 1/1993 |
| EP | 0523931 A2 | 1/1993 |
| EP | 0524731 A1 | 1/1993 |
| EP | 0693470 B1 | 5/1998 |
| EP | 0885929 A1 | 12/1998 |
| EP | 0676237 B1 | 3/1999 |
| EP | 1160229 A1 | 12/2001 |
| EP | 1201303 A1 | 5/2002 |
| EP | 1234845 A2 | 8/2002 |
| EP | 1273563 A1 | 1/2003 |
| EP | 1127090 B1 | 4/2003 |
| EP | 0788839 B1 | 5/2003 |
| EP | 1371623 A1 | 12/2003 |
| EP | 1459805 A1 | 9/2004 |
| EP | 1500671 A1 | 1/2005 |
| EP | 2143750 A1 | 1/2005 |
| EP | 1222960 B1 | 8/2005 |
| EP | 1808726 A1 | 7/2007 |
| EP | 1925874 A1 | 5/2008 |
| EP | 1520617 B1 | 2/2009 |
| EP | 2248841 A1 | 11/2010 |
| FR | 2685221 A1 | 6/1993 |
| FR | 2685323 A1 | 6/1993 |
| GB | 1377227 A | 12/1974 |
| JP | 5271132 A | 10/1993 |
| JP | 5294875 A | 11/1993 |
| JP | 5294876 A | 11/1993 |
| JP | 8038910 A | 2/1996 |
| JP | 08071433 A | 3/1996 |
| JP | 08319248 A * | 12/1996 |
| JP | 08325185 A | 12/1996 |
| JP | 10211434 A | 8/1998 |
| JP | 10251180 A | 9/1998 |
| JP | 10314595 A | 12/1998 |
| JP | 10328573 A | 12/1998 |
| JP | 11179210 A | 7/1999 |
| JP | 11246458 A | 9/1999 |
| JP | 11255748 A | 9/1999 |
| JP | 2000281607 A | 10/2000 |
| JP | 2000281608 A | 10/2000 |
| JP | 2000319216 A | 11/2000 |
| JP | 2001233812 A | 8/2001 |
| JP | 2004149623 A | 5/2004 |
| JP | 2004231935 A | 8/2004 |
| JP | 2005037591 A | 2/2005 |
| JP | 2005048154 A | 2/2005 |
| JP | 2005082713 A | 3/2005 |
| JP | 2005115051 A | 4/2005 |
| JP | 2006124600 | 5/2006 |
| JP | 2006124600 A * | 5/2006 |
| JP | 2006339033 A | 12/2006 |
| JP | 2008184482 A | 8/2008 |
| JP | 2011029051 A | 2/2011 |
| JP | 2012131835 A | 7/2012 |
| KR | 20110033772 A | 3/2011 |
| WO | 9209550 A1 | 6/1992 |
| WO | 9708122 A1 | 3/1997 |
| WO | 0050372 A1 | 8/2000 |
| WO | 0055249 A1 | 9/2000 |
| WO | 0059853 A1 | 10/2000 |
| WO | 2008100165 A1 | 8/2008 |
| WO | 2008118180 A1 | 10/2008 |
| WO | 2011082204 A1 | 7/2011 |
| WO | 2011134674 A1 | 11/2011 |
| WO | 2012135584 A2 | 10/2012 |
| WO | 2012150559 A1 | 11/2012 |
| WO | 2012150560 A1 | 11/2012 |
| WO | 2013021332 A1 | 2/2013 |
| WO | 2013061274 A1 | 5/2013 |
| WO | 2014066784 A1 | 5/2014 |

OTHER PUBLICATIONS

Written Opinion for International Application No. PCT/US2013/066855, International Application Filing Date Oct. 25, 2013, dated Apr. 2, 2014, 6 pages.

XP002719190 Database WPI, Week 200636, Thomson Scientific, London, GB; AN2006-347219.

Al-Shammary; "The Effect of Inorganic Pigment on the Tensile Properties of Polycabonate Irradiated with UV-Light"; Iraqi Journal of Physics; vol. 9, No. 16; 2011; pp. 52-56.

Gupta et al.; "Thermo and Photo Oxidative Behavior of Poly (phenylene ether) Based Thermoplastics Elastomers"; ANTEC 2011; Nov. 19, 2010; 8 Pages.

KR101233678 B1, Feb. 15, 2013, with English Abstract, 15 pages.

Nowakowska et al., "Studies of Some Impurities in Commercial Bisphenol-A", Polish J. Appl. Chem., XI(3), pp. 247-254 (1996).

Anderson et al.; "Quantitative Analysis of Commercial Bisphenol A by Paper Chromatography"; Analytical Chemistry; vol. 31, No. 7; 1959; p. 1214-1217.

Brunelle, D.J.: "Polycarbonates", Encyclopedia of Polymer Science and Technology, Jan. 1, 2006, pp. 1.1-33, XP002525090, DOI: 10.1002/0471440264PST255.PUB2, 1999-2014, Retrieved from the Internet: URL: http://mrw.interscience.wiley.com/emrw/9780471440260/epst/article/p.

Brydia; "Determination of Bisphenol A and Impurities by Gas Chromatography of Their Trimethylsilyl Ether Derivatives" Analytical Chemistry; vol. 40, No. 14; 1968; pp. 2212-2215.

Chan et al., "Facile Quantitative Analysis of Hydroxyl End Groups of Poly (2,6-dimethyl-1,4-phenylene oxide)s by 31P NMR Spectroscopy", Macromolecules (1994), vol. 27, pp. 6371-6375.

Anonymous, "Polycarbonate preparation with a low yellowness index," Research Disclosure, Mason Publications, Hampshire GB vol. 449, No. 49 (Sep. 1, 2001) ISSN: 0374-4353 pp. 1-3.

(56) References Cited

OTHER PUBLICATIONS

Machine Translation of CN101104803(A); Date of Publication: Jan. 16, 2008; 6 Pages.
Machine Translation of CN101358133A; Date of Publication: Feb. 4, 2009; 12 Pages.
Machine Translation of CN101325238A; Date of Publication: Dec. 17, 2008; 13 Pages.
Chinese Pat. No. 101205358 (A); Publication Date: Jun. 25, 2008; Abstract Only; 1 Page.
Chinese Pat. No. 101885907 (A); Publication Date: Nov. 17, 2010; Abstract Only; 1 Page.
Chinese Pat. No. 102134383 (A); Publication Date: Jul. 27, 2011; Abstract Only; 1 Page.
Chinese Pat. No. 1204664(A); Date of Publication: Jan. 13, 1999; Machine Translation; 10 Pages.
Chinese Pat. No. 202091807 (U); Publication Date: Dec. 28, 2011; Abstract Only; 1 Page.
Chou et al.; "The Optimum Conditions for Solid-State-Prepared (Y3-xCex)Al5O12 Phosphor Using the Taguchi Method"; Advanced Powder Technology; vol. 12; 2012; pp. 97-103.
Cytec; Cyasorb UV-5411 Product Safety Summary; Cytec; Dec. 2012; pp. 1-5.
De Brouwer et al.; "Lexan* Polycarbonate for Optical Applications"; SABIC Innovative Plastics; Received Aug. 2, 2011; 5 Pages.
DuPont T-Pure—Titanium Dioxide; Polymers, Light and the Science of TiO2; Copyright 2007; 20 Pages.
English Abstract of JP08038910(A); Date of Publication: Feb. 13, 1996; 1 Page.
English Abstract of JP08071433(A); Date of Publication: Mar. 19, 1996; 1 Page.
English Abstract of JP08325185(A); Date of Publication: Dec. 10, 1996; 2 Pages.
English Abstract of JP10211434(A); Date of Publication: Aug. 11, 1998; 2 Pages.
English Abstract of JP10251180(A); Date of Publication: Sep. 22, 1998; 1 Page.
English Abstract of JP10314595(A); Date of Publication: Dec. 2, 1998; 2 Pages.
English Abstract of JP10328573(A); Date of Publication: Dec. 15, 1998; 1 Page.
English Abstract of JP11179210(A); Date of Publication: Jul. 6, 1999; 2 Pages.
English Abstract of JP11246458(A); Date of Publication: Sep. 14, 1999; 1 Page.
English Abstract of JP11255748(A); Date of Publication: Sep. 21, 1999; 1 Page.
English Abstract of JP2000281607(A); Date of Publication: Oct. 10, 2000; 1 Page.
English Abstract of JP2000281608(A); Date of Publication: Oct. 10, 2000; 1 Page.
English Abstract of JP2000319216(A); Date of Publication: Nov. 21, 2000; 1 Page.
Abstract of JP2001233812(A); Date of Publication: Aug. 28, 2001; 1 Page.
English Abstract of JP5271132(A); Date of Publication: Oct. 19, 1993; 2 Pages.
English Abstract of JP5294875(A); Date of Publication: Nov. 9, 1993; 2 Pages.
English Abstract of JP5294876(A); Date of Publication: Nov. 9, 1993; 1 Page.
Factor et al.; "The Use of 31P NMR to Identify Color Bodies in y-irradiated Bisphenol-A Polycarbonate*"; Polymer Degradation and Stability; vol. 57; 1997; pp. 83-86.
German Pat. No. 19503470 A1; Date of Publication Aug. 8, 1996; 2 pages; English Abstract.
Godinez et al.; "Experimental Study of the Influence of Raw Material Impurities on Yellowness Index of Transesterification Polycarbonate"; Journal of Applied Polymer Science; vol. 119; 2011; pp. 1348-1356.
Ishihara Sangyo; "Titanium Dioxide Products" White Pigments; Ishihara Sangyo KK; 2012; 7 pages.
Japanese Pat. No. 2004149623 (A); Publication Date: May 27, 2004; Abstract Only; 1 Page.
Japanese Pat. No. 2004231935 (A); Publication Date: Aug. 19, 2004; Abstract Only; 1 Page.
Japanese Pat. No. 2005037591 (A); Publication Date: Feb. 10, 2005; Abstract Only; 2 Pages.
Japanese Pat. No. 2005048154 (A); Publication Date: Feb. 24, 2005; Abstract Only; 1 Page.
Japanese Pat. No. 2005082713 (A); Publication Date: Mar. 31, 2005; Abstract Only; 2 Pages.
Japanese Pat. No. 2005115051 (A); Publication Date: Apr. 28, 2005; Abstract Only; 1 Page.
Japanese Pat. No. 2006339033 (A); Publication Date: Dec. 14, 2006; Abstract Only; 2 Pages.
Japanese Pat. No. 2008184482 (A); Publication Date: Aug. 14, 2008; Abstract Only; 1 Page.
Japanese Pat. No. 2011029051 (A); Publication Date: Feb. 10, 2011; Abstract Only; 2 Pages.
Japanese Pat. No. 2012131835 (A); Publication Date: Jul. 12, 2012; Machine Translation from the Japanese Patent Office; 13 Pages.
Li et al.; "Design of Mechanically Robust High-Tg Polymers: Synthesis and Dynamic Machanical Relaxation Behavior of Glassy Poly(ester carbonate)s with Cyclohexylene Rings in the Backbone"; Macromolecules; vol. 36; 2003; pp. 9411-9420.
Liptak et al.; "Absolute pKa Determination for Substituted Phenols"; J. Am. Chem. Soc.; vol. 124; 2002; pp. 6421-6427.
Machine Translation of CN1853118(A); Date of Publication: Oct. 25, 2006; 48 Pages.
Machine Translation of FR2685221(A1); Date of Publication: Jun. 25, 1993; 26 Pages.
Machine Translation of FR2685323(A1); Date of Publication: Jun. 25, 1993; 26 Pages.
Machine Translation of JP08319248(A); Date of Publication: Dec. 3, 1996; 8 Pages.
Poskrobko et al.; "High-Performance Liquid Chromatography wtih Multi-Wavelength Detection of the Bisphenol A Impurities"; Journal of Chromatography A; vol. 883; 2000; pp. 291-297.
Yamada et al.; "Sequential-color LCD based on OCB with an LED backlight"; Journal of the SID; Oct. 1; 2002; 5 pages.

\* cited by examiner

LIGHT EMITTING DIODE DEVICES, METHOD OF MANUFACTURE, USES THEREOF

CROSS REFERENCE TO RELATED APPLICATIONS

The present application claims priority to U.S. Provisional Application Ser. No. 61/718,400, filed Oct. 25, 2012, the contents of which are incorporated herein by reference in their entirety.

BACKGROUND

This disclosure is directed to light emitting diode (LED) devices and materials for LED device components, and in particular to LED lighting devices comprising polycarbonates.

LEDs are semiconductor devices that emit incoherent narrow-spectrum light when electrically biased in the forward direction of their p-n junctions (boundary between P-type and N-type semiconductor), and are thus referred to as solid-state lighting devices.

LEDs can be used in applications as diverse as aviation lighting, automotive lighting, advertising, indoor lighting and traffic signals. Recently, with the development of LED technology, LEDs are fast replacing incandescent and fluorescent lighting. Compared to other lighting devices, LED products offer longer life span and higher efficiency.

The lifetime of LED products can be from 25,000 to 100,000 hours. However, heat can shorten this time significantly. With the development of high-power LED chips, the LED devices are subject to higher junction temperatures. This causes stress on the material for LED components, which may lead to early failure of the devices. The most common symptom of LED failure is the gradual lowering of light output and loss of efficiency due to the yellowing of LED housing materials. Sudden failures, although rare, can occur as well. Thus, LED lighting devices having higher light output and less yellowing components over its lifetime are continually sought.

BRIEF DESCRIPTION

A light emitting diode device comprises a light emitting diode and a device component, wherein the device component comprises a polycarbonate composition comprising a bisphenol A polycarbonate; and 2,2'-(1,4-phenylene)bis(4H-3,1-benzoxazin-4-one) in an amount effective to provide a composition wherein a molded sample of the composition has a UL94 rating of V-2 or better at a thickness of 0.9 mm; an absorbance of less than 2 a.u. in the region of 370 to 380 nanometers; and for a sample having a thickness of 2.5 mm, an increase in yellowness index ($\Delta$YI) of 12 or less after heat aging at 130° C. for 5,000 as measured by ASTM D1925. In an embodiment the device is a lighting device.

In another embodiment, a light emitting diode device comprises a light emitting diode and a device component, wherein the polycarbonate composition comprises, consists essentially of, or consists of 90 to 99.9 wt. % of the bisphenol A polycarbonate, 0.001 to 1 wt. % of the 2,2'-(1, 4-phenylene)bis(4H-3,1-benzoxazin-4-one), 0.0001 to 1 wt. % of a thermal stabilizing additive, 0.0001 to 1 wt. % of an antioxidant, 0.001 to 1 wt. % of a mold release agent, 0.1 to 10 wt. % of a flame retardant, 0 to 1 wt. % of a colorant, 0 to 1% of a gamma-stabilizing agent, 0 to 10% of a filler, 0 to 20 wt. % of a conversion material, 0 to 1.5 wt. % of a light diffuser, or a combination comprising at least one of the foregoing optional materials, wherein a molded article of the polycarbonate composition has transmission level greater than or equal to 90% at 2.5 mm thickness as measured by ASTM D1003-00. In an embodiment the device is a lighting device.

In another embodiment, a light emitting diode device comprises a light emitting diode and a device component, wherein the polycarbonate composition comprises, consists essentially of, or consists of 95 to 99.8 wt. % of the bisphenol A homopolycarbonate, 0.001 to 0.5 wt. % of the 2,2'-(1,4-phenylene)bis(4H-3,1-benzoxazin-4-one), 0.0001 to 1 wt. % of a thermal stabilizing additive, 0.0001 to 1 wt. % of an antioxidant, 0.001 to 1 wt. % of a mold release agent, 0.1 to 10 wt. % of a flame retardant, wherein the flame retardant is potassium perfluorobutane sulfonate, potassium diphenylsulfone sulfonate, or a combination comprising at least one of the foregoing flame retardants, 0.001 to 1.5 wt. % of a light diffuser, wherein the light diffuser is a poly(alkyl acrylate), a poly(alkyl methacrylate), a poly(alkylsilsequioxane), a poly(tetrafluoroethylene), or a combination comprising at least one of the foregoing light diffusers, 0 to 1 wt. % of a colorant, 0 to 1% of a gamma-stabilizing agent, 0 to 10% of a filler, 0 to 20 wt. % of a conversion material, or a combination comprising at least one of the foregoing optional materials, wherein a molded article of the polycarbonate composition has transmission level greater than or equal to 40% at 2.5 mm thickness as measured by ASTM D1003-00. In an embodiment the device is a lighting device.

In another embodiment, a light emitting diode device comprises a light emitting diode and a device component, wherein the polycarbonate composition comprises, consists essentially of, or consists of 95 to 99.8 wt. % of the bisphenol A homopolycarbonate, 0.001 to 0.5 wt. % of the 2,2'-(1,4-phenylene)bis(4H-3,1-benzoxazin-4-one), 0.0001 to 1 wt. % of a thermal stabilizing additive, 0.0001 to 1 wt. % of an antioxidant, 0.001 to 1 wt. % of a mold release agent, 0.1 to 10 wt. % of a flame retardant, wherein the flame retardant is potassium perfluorobutane sulfonate, potassium diphenylsulfone sulfonate, or a combination comprising at least one of the foregoing flame retardants, substantially no light diffuser, 0 to 1 wt. % of a colorant, 0 to 1% of a gamma-stabilizing agent, 0 to 10% of a filler, 0 to 20 wt. % of a conversion material, or a combination comprising at least one of the foregoing optional materials, wherein a molded article of the polycarbonate composition has transmission level greater than or equal to 90% at 2.5 mm thickness as measured by ASTM D1003-00. In an embodiment the device is a lighting device.

Also disclosed is a process to reduce photodegradation of a component of a device exposed to light comprising a component having a wavelength of 400 nm to 500 nm and a component having a wavelength of 10 nm to 400 nm. The process comprises molding a polycarbonate composition to form the component of the device, wherein the polycarbonate composition comprises a bisphenol A polycarbonate and an ultraviolet light absorber in an amount effective to provide a composition wherein a molded sample of the composition has a UL94 rating of V-2 or better at a thickness of 0.9 mm; an absorbance of less than 2 a.u. in the region of 370 to 380 nanometers; and an increase in yellowness index ($\Delta$YI) of 12 or less at a thickness of 2.5 mm after heat aging at 130° C. for 5,000 hours, as measured by ASTM D1925; and exposing the component of the device to a light emitting diode excitation/transmission source for a selected period of time. In an embodiment the device is a lighting emitting diode device, in particular a lighting device.

In another embodiment, disclosed is a process to decrease light absorption in the range of 370 to 380 nanometers of a component of a device exposed to light comprising a component having a wavelength of 400 nm to 500 nm and a component having a wavelength of 10 nm to 400 nm. The process comprises molding a polycarbonate composition to form the component of the device, wherein the polycarbonate composition comprises a bisphenol A polycarbonate and an ultraviolet light absorber in an amount effective to provide a composition wherein a molded sample of the composition has a UL94 rating of V-2 or better at a thickness of 0.9 mm, an absorbance of less than 2 a.u. in the region of 370 to 380 nanometers; and for a sample having a thickness of 2.5 mm, an increase in yellowness index ($\Delta YI$) of 12 or less after heat aging at 130° C. for 5,000 hours, as measured by ASTM D1925; and exposing the component of the device to a light emitting diode excitation/transmission source for a selected period of time. In an embodiment the device is a lighting emitting diode device, in particular a lighting device.

These and other non-limiting characteristics are more particularly described below.

BRIEF DESCRIPTION OF DRAWINGS

A description of the figures, which are meant to be exemplary and not limiting, is provided in which.

DETAILED DESCRIPTION

Figure 1:
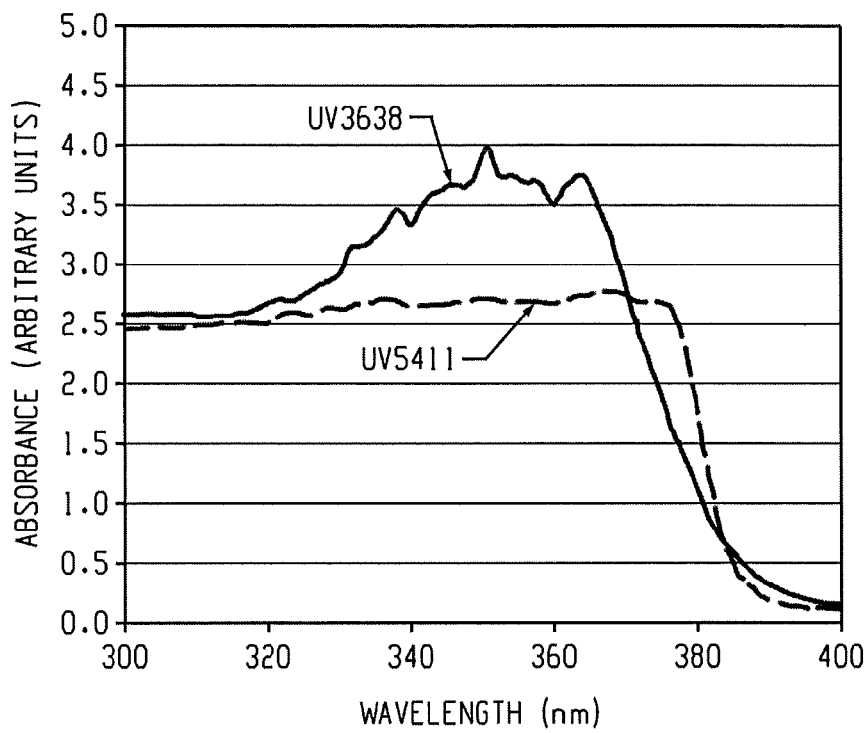
FIG. 1 is a graph illustrating the absorbance difference between polycarbonate samples containing UV5411 and UV3638.

Polycarbonate is a high-performance polymer with good impact strength (ductility), and can be used as material for LED device components. However, polycarbonate can degrade over time and turn yellow due to heat aging. The inventors have surprisingly found that the yellowness of polycarbonate may accelerate its degradation, particularly when used in LED applications. After extensive research and study, the inventors provide a solution to this problem.

Without being bound by theory, it is believed that the yellowing of polycarbonate leads to absorption of light, especially the portion of LED light having a wavelength of 400 nm to 500 nm ("blue component"). It is believed that the increased absorption of the blue component of LED light results in increased temperatures of the polycarbonate, which in turn results in accelerated heat aging and yellowing. This can cause a decrease in LED light output, sometimes even a catastrophic failure of the LED component, such as lens or bulbs for LED devices, typically observed as severe browning and deformation/melting of the component material. Again without wishing to be bound by any theory, it is believed that the less blue component of LED light the polycarbonate absorbs, the longer the acceleration effect can be delayed thus prolonging the lifetime of the LED lighting devices.

UV absorbers can be used to protect polycarbonates from UV light absorption. However, the inventors have discovered that certain UV absorbers not only absorb UV light, but also absorb the blue component of LED light. Due to this absorption, certain UV stabilized polycarbonates can become more yellow in color than non-UV stabilized polycarbonates after being exposed to LED light. The inventors have also discovered that UV absorbers having hydroxyl functional groups can react with polycarbonates at elevated temperatures thus causing the UV stabilized polycarbonates to become more yellow than non-UV stabilized polycarbonate under heat generated by LED lighting devices. As discussed above, the yellowness of polycarbonate can lead to accelerated degradation of the material, hence shortening the lifetime of LED devices that contain components formed from such polycarbonate.

The inventors have surprisingly found that UV absorbers that do not contain a hydroxyl group, in particular, 2,2'-(1, 4-phenylene)bis(4H-3,1-benzoxazin-4-one) can offer excellent UV protection to bisphenol A polycarbonates, while at the same time absorbing less blue component of LED light as compared to UV absorbers such as 2-(2H-benzotriazol-2-yl)-4-(1,1,3,3-tetramethylbutyl)-phenol. This offers the opportunity to develop UV stabilized polycarbonates that have longer optical lifetime for use in LED applications.

As is known, a polycarbonate is a polymer having repeating structural carbonate units of formula (1).

(1)

A "bisphenol A polycarbonate" as used herein means a polycarbonate having at least 80 mole percent ("mol %"), at least 90 mol %, or at least 95 mol % of repeating structural bisphenol A carbonate units of formula (1a)

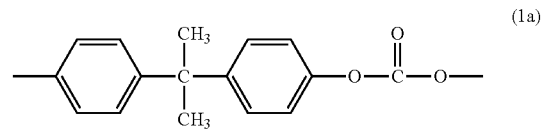

(1a)

based on the total moles of structural units in the polycarbonate. Bisphenol A polycarbonate units can be derived from 2,2-bis(4-hydroxyphenyl)propane (hereinafter "bisphenol A" or "BPA") of formula (2)

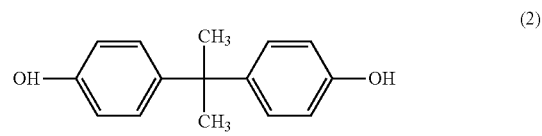

(2)

"Bisphenol A polycarbonate" as used herein includes homopolycarbonates derived from bisphenol A. Also included are copolymers derived from bisphenol A and a diol, e.g., a bisphenol other than bisphenol A. Other types of copolymers within the scope of bisphenol A polycarbonates comprise (i) carbonate units derived from bisphenol A (and optionally other dihydric alcohols) and (ii) other types of polymer units, such as ester units or siloxane units. In an embodiment, the polycarbonate is a bisphenol A homopolycarbonate.

Bisphenol A polycarbonate copolymers comprise units of formula (1a) and units of formula (1) wherein $R^1$ is a $C_{1-12}$ aliphatic group or a $C_{6-30}$ aromatic group derived from a dihydroxy compound of the formula HO—$R^1$—OH, in particular of formula (2a)

wherein each of $A^1$ and $A^2$ is a monocyclic divalent aromatic group and $Y^1$ is a single bond or a bridging group having one or more atoms that separate $A^1$ from $A^2$. In an embodiment, one atom separates $A^1$ from $A^2$. Specifically, each $R^1$ can be derived from a dihydroxy aromatic compound of formula (3)

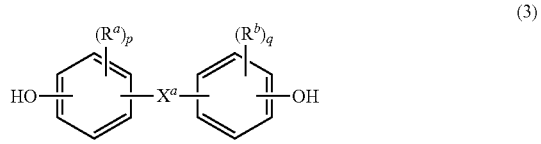

wherein $R^a$ and $R^b$ are each independently a halogen, $C_{1-12}$ alkoxy, or $C_{1-12}$ alkyl; and p and q are each independently integers of 0 to 4. It will be understood that $R^a$ is hydrogen when p is 0, and likewise $R^b$ is hydrogen when q is 0. Also in formula (3), $X^a$ is a bridging group connecting the two hydroxy-substituted aromatic groups, where the bridging group and the hydroxy substituent of each $C_6$ arylene group are disposed ortho, meta, or para (specifically para) to each other on the $C_6$ arylene group. In an embodiment, the bridging group $X^a$ is single bond, —O—, —S—, —S(O)—, —S(O)$_2$—, —C(O)—, or a $C_{1-18}$ organic group. The $C_{1-18}$ organic bridging group can be cyclic or acyclic, aromatic or non-aromatic, and can further comprise heteroatoms such as halogens, oxygen, nitrogen, sulfur, silicon, or phosphorous. The $C_{1-18}$ organic group can be disposed such that the $C_6$ arylene groups connected thereto are each connected to a common alkylidene carbon or to different carbons of the $C_{1-18}$ organic bridging group. In an embodiment, p and q is each 1, and $R^a$ and $R^b$ are each a $C_{1-3}$ alkyl group, specifically methyl, disposed meta to the hydroxy group on each arylene group.

In an embodiment, $X^a$ is a substituted or unsubstituted $C_{3-18}$ cycloalkylidene, a $C_{1-25}$ alkylidene of formula —C($R^c$)($R^d$)— wherein $R^c$ and $R^d$ are each independently hydrogen, $C_{1-12}$ alkyl, $C_{1-12}$ cycloalkyl, $C_{7-12}$ arylalkyl, $C_{1-12}$ heteroalkyl, or cyclic $C_{7-12}$ heteroarylalkyl, or a group of the formula —C(=$R^e$)— wherein $R^e$ is a divalent $C_{1-12}$ hydrocarbon group. groups of this type include methylene, cyclohexylmethylene, ethylidene, neopentylidene, and isopropylidene, as well as 2-[2.2.1]-bicycloheptylidene, cyclohexylidene, cyclopentylidene, cyclododecylidene, and adamantylidene.

In another embodiment, $X^a$ is a $C_{1-18}$ alkylene group, a $C_{3-18}$ cycloalkylene group, a fused $C_{6-18}$ cycloalkylene group, or a group of the formula —$B^1$-G-$B^2$— wherein $B^1$ and $B^2$ are the same or different $C_{1-6}$ alkylene group and G is a $C_{3-12}$ cycloalkylidene group or a $C_{6-16}$ arylene group. For example, $X^a$ can be a substituted $C_{3-18}$ cycloalkylidene of formula (4)

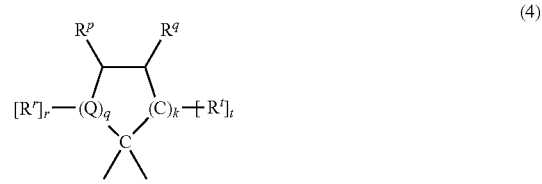

wherein $R^r$, $R^p$, $R^q$, and $R^t$ are each independently hydrogen, halogen, oxygen, or $C_{1-12}$ hydrocarbon groups; Q is a direct bond, a carbon, or a divalent oxygen, sulfur, or —N(Z)— where Z is hydrogen, halogen, hydroxy, $C_{1-12}$ alkyl, $C_{1-12}$ alkoxy, or $C_{1-12}$ acyl; r is 0 to 2, t is 1 or 2, q is 0 or 1, and k is 0 to 3, with the proviso that at least two of $R^r$, $R^p$, $R^q$, and $R^t$ taken together are a fused cycloaliphatic, aromatic, or heteroaromatic ring. It will be understood that where the fused ring is aromatic, the ring as shown in formula (4) will have an unsaturated carbon-carbon linkage where the ring is fused. When k is one and i is 0, the ring as shown in formula (4) contains 4 carbon atoms, when k is 2, the ring as shown in formula (4) contains 5 carbon atoms, and when k is 3, the ring contains 6 carbon atoms. In an embodiment, two adjacent groups (e.g., $R^q$ and $R^t$ taken together) form an aromatic group, and in another embodiment, $R^q$ and $R^t$ taken together form one aromatic group and $R^r$ and $R^p$ taken together form a second aromatic group. When $R^q$ and $R^t$ taken together form an aromatic group, $R^p$ can be a double-bonded oxygen atom, i.e., a ketone.

Bisphenols (4) can be used in the manufacture of polycarbonates containing phthalimidine carbonate units of formula (4a)

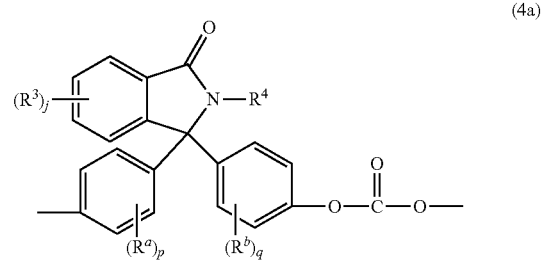

wherein $R^a$, $R^b$, p, and q are as in formula (4), $R^3$ is each independently a $C_{1-6}$ alkyl group, j is 0 to 4, and $R_4$ is a $C_{1-6}$ alkyl, phenyl, or phenyl substituted with up to five $C_{1-6}$ alkyl groups. In particular, the phthalimidine carbonate units are of formula (4b)

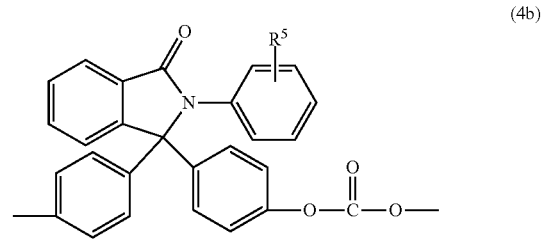

wherein $R^5$ is hydrogen or a $C_{1-6}$ alkyl. In an embodiment, $R^5$ is hydrogen. Carbonate units (4a) wherein $R^5$ is hydrogen can be derived from 2-phenyl-3,3'-bis(4-hydroxy phenyl) phthalimidine (also known as N-phenyl phenolphthalein bisphenol, or "PPPBP") (also known as 3,3-bis(4-hydroxyphenyl)-2-phenylisoindolin-1-one).

Other bisphenol carbonate repeating units of this type are the isatin carbonate units of formula (4c) and (4d)

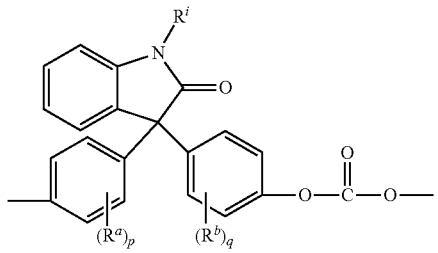

(4c)

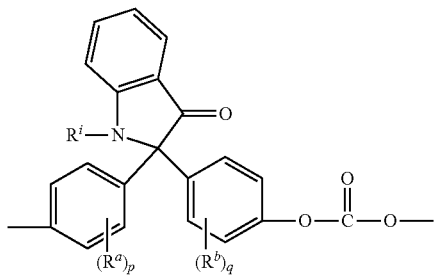

(4d)

wherein $R^a$ and $R^b$ are each independently $C_{1-12}$ alkyl, p and q are each independently 0 to 4, and $R^i$ is $C_{1-12}$ alkyl, phenyl, optionally substituted with 1 5 to $C_{1-10}$ alkyl, or benzyl optionally substituted with 1 to 5 $C_{1-10}$ alkyl. In an embodiment, $R^a$ and $R^b$ are each methyl, p and q are each independently 0 or 1, and $R^i$ is $C_{1-4}$ alkyl or phenyl.

Examples of bisphenol carbonate units derived from bisphenols (4) wherein $X^b$ is a substituted or unsubstituted $C_{3-18}$ cycloalkylidene include the cyclohexylidene-bridged, alkyl-substituted bisphenol of formula (4e)

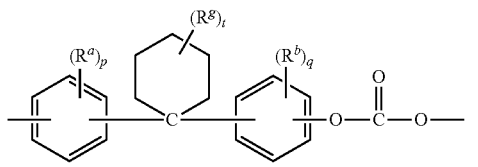

(4e)

wherein $R^a$ and $R^b$ are each independently $C_{1-12}$ alkyl, $R^g$ is $C_{1-12}$ alkyl, p and q are each independently 0 to 4, and t is 0 to 10. In a specific embodiment, at least one of each of $R^a$ and $R^b$ are disposed meta to the cyclohexylidene bridging group. In an embodiment, $R^a$ and $R^b$ are each independently $C_{1-4}$ alkyl, $R^g$ is $C_{1-4}$ alkyl, p and q are each 0 or 1, and t is 0 to 5. In another specific embodiment, $R^a$, $R^b$, and $R^g$ are each methyl, r and s are each 0 or 1, and t is 0 or 3, specifically 0. For example, Examples of other bisphenol carbonate units derived from bisphenol (4) wherein $X^b$ is a substituted or unsubstituted $C_{3-18}$ cycloalkylidene include adamantyl units (4f) and units (4g)

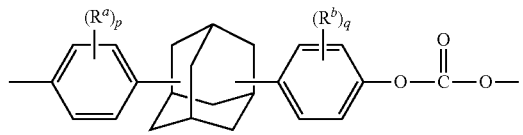

(4f)

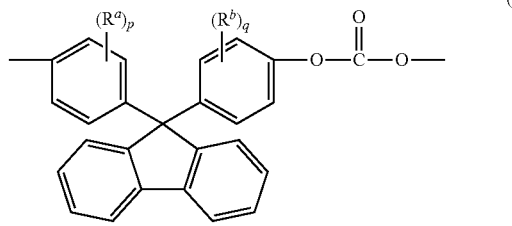

(4g)

wherein $R^a$ and $R^b$ are each independently $C_{1-12}$ alkyl, and p and q are each independently 1 to 4. In a specific embodiment, at least one of each of $R^a$ and $R^b$ are disposed meta to the cycloalkylidene bridging group. In an embodiment, $R^a$ and $R^b$ are each independently $C_{1-3}$ alkyl, and p and q are each 0 or 1. In another specific embodiment, $R^a$, $R^b$ are each methyl, p and q are each 0 or 1. Carbonates containing units (4a) to (4g) are useful for making polycarbonates with high glass transition temperatures (Tg) and high heat distortion temperatures.

Other useful aromatic dihydroxy compounds of the formula HO—$R^1$—OH include compounds of formula (6)

(6)

wherein each $R^h$ is independently a halogen atom, a $C_{1-10}$ hydrocarbyl such as a $C_{1-10}$ alkyl group, a halogen-substituted $C_{1-10}$ alkyl group, a $C_{6-10}$ aryl group, or a halogen-substituted $C_{6-10}$ aryl group, and n is 0 to 4. The halogen is usually bromine.

Some illustrative examples of specific aromatic dihydroxy compounds include the following 4,4'-dihydroxybiphenyl, 1,6-dihydroxynaphthalene, 2,6-dihydroxynaphthalene, bis(4-hydroxyphenyl)methane, bis(4-hydroxyphenyl) diphenylmethane, bis(4-hydroxyphenyl)-1-naphthylmethane, 1,2-bis(4-hydroxyphenyl)ethane, 1,1-bis (4-hydroxyphenyl)-1-phenylethane, 2-(4-hydroxyphenyl)-2-(3-hydroxyphenyl)propane, bis(4-hydroxyphenyl) phenylmethane, 2,2-bis(4-hydroxy-3-bromophenyl) propane, 1,1-bis(hydroxyphenyl)cyclopentane, 1,1-bis(4-hydroxyphenyl)cyclohexane, 1,1-bis(4-hydroxyphenyl) isobutene, 1,1-bis(4-hydroxyphenyl)cyclododecane, trans-2,3-bis(4-hydroxyphenyl)-2-butene, 2,2-bis(4-hydroxyphenyl)adamantane, alpha, alpha'-bis(4-hydroxyphenyl)toluene, bis(4-hydroxyphenyl)acetonitrile, 2,2-bis(3-methyl-4-hydroxyphenyl)propane, 2,2-bis(3-ethyl-4-hydroxyphenyl)propane, 2,2-bis(3-n-propyl-4-hydroxyphenyl)propane, 2,2-bis(3-isopropyl-4-hydroxyphenyl)propane, 2,2-bis(3-sec-butyl-4-hydroxyphenyl)propane, 2,2-bis(3-t-butyl-4-hydroxyphenyl)propane, 2,2-bis(3-cyclohexyl-4-hydroxyphenyl)propane, 2,2-bis(3-allyl-4-hydroxyphenyl)propane, 2,2-bis(3-methoxy-4-hydroxyphenyl)propane, 2,2-bis(4-hydroxyphenyl)hexafluoropropane, 1,1-dichloro-2,2-bis(4-hydroxyphenyl)ethylene, 1,1-dibromo-2,2-bis(4-hydroxyphenyl)ethylene, 1,1-dichloro-2,2-bis(5-phenoxy-4-hydroxyphenyl)ethylene, 4,4'-dihydroxybenzophenone, 3,3-bis(4-hydroxyphenyl)-2-butanone, 1,6-bis(4-hydroxyphenyl)-1,6-hexanedione, ethylene glycol bis(4-hydroxyphenyl)ether, bis(4-hydroxyphenyl)ether, bis(4-hydroxyphenyl)sulfide, bis(4-hydroxyphenyl)sulfoxide, bis(4-hydroxyphenyl)sulfone, 9,9-bis(4-hydroxyphenyl)fluorine, 2,7-dihydroxypyrene, 6,6'-dihydroxy-3,3,3',3'-tetramethylspiro(bis)indane ("spirobiindane bisphenol"), 3,3-bis(4-hydroxyphenyl)phthalimide, 2,6-dihydroxydibenzo-p-dioxin, 2,6-dihydroxythianthrene, 2,7-dihydroxyphenoxathin, 2,7-dihydroxy-9,10-dimethylphenazine, 3,6-dihydroxydibenzofuran, 3,6-dihydroxydibenzothiophene, and 2,7-dihydroxycarbazole, resorcinol, substituted resorcinol compounds such as 5-methyl resorcinol, 5-ethyl resorcinol, 5-propyl resorcinol, 5-butyl resorcinol, 5-t-butyl resorcinol, 5-phenyl resorcinol, 5-cumyl resorcinol, 2,4,5,6-tetrafluoro resorcinol, 2,4,5,6-tetrabromo resorcinol, or the like; catechol; hydroquinone; substituted hydroquinones such as 2-methyl hydroquinone, 2-ethyl hydroquinone, 2-propyl hydroquinone, 2-butyl hydroquinone, 2-t-butyl hydroquinone, 2-phenyl hydroquinone, 2-cumyl hydroquinone, 2,3,5,6-tetramethyl hydroquinone, 2,3,5,6-tetra-t-butyl hydroquinone, 2,3,5,6-tetrafluoro hydroquinone, 2,3,5,6-tetrabromo hydroquinone, or the like, or combinations comprising at least one of the foregoing dihydroxy compounds.

Specific examples of bisphenol compounds of formula (3) include 1,1-bis(4-hydroxyphenyl)methane, 1,1-bis(4-hydroxyphenyl)ethane, 2,2-bis(4-hydroxyphenyl)butane, 2,2-bis(4-hydroxyphenyl)octane, 1,1-bis(4-hydroxyphenyl)propane, 1,1-bis(4-hydroxyphenyl) n-butane, 2,2-bis(4-hydroxy-2-methylphenyl)propane, 1,1-bis(4-hydroxy-t-butylphenyl)propane, 3,3-bis(4-hydroxyphenyl)phthalimidine, 2-phenyl-3,3-bis(4-hydroxyphenyl) phthalimidine (PPPBP), and 1,1-bis(4-hydroxy-3-methylphenyl)cyclohexane (DMBPC). Combinations comprising at least one of the foregoing dihydroxy compounds can also be used. In one specific embodiment, the polycarbonate is a linear homopolymer derived from bisphenol A, in which each of $A^1$ and $A^2$ is p-phenylene and $Y^1$ is isopropylidene in formula (3).

Polyester carbonates, also known as polyester-polycarbonates can also be used. Such copolymers further contain, in addition to recurring carbonate chain units (including bisphenol A units (1a)), repeating units of formula (7)

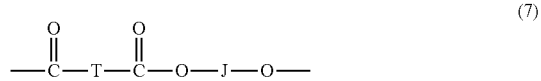

(7)

wherein J is a divalent group derived from a dihydroxy compound, and can be, for example, a $C_{2-10}$ alkylene, a $C_{6-20}$ cycloalkylene a $C_{6-20}$ arylene, or a polyoxyalkylene group in which the alkylene groups contain 2 to 6 carbon atoms, specifically 2, 3, or 4 carbon atoms; and T is a divalent group derived from a dicarboxylic acid, and can be, for example, a $C_{2-10}$ alkylene, a $C_{6-20}$ cycloalkylene, or a $C_{6-20}$ arylene. Copolyesters containing a combination of different T and/or J groups can be used. The polyesters can be branched or linear.

In an embodiment, J is a $C_{2-30}$ alkylene group having a straight chain, branched chain, or cyclic (including polycyclic) structure. In another embodiment, J is derived from an aromatic dihydroxy compound of formula (3) above. In another embodiment, J is derived from an aromatic dihydroxy compound of formula (4) above. In another embodiment, J is derived from an aromatic dihydroxy compound of formula (6) above.

Aromatic dicarboxylic acids that can be used to prepare the polyester units include isophthalic or terephthalic acid, 1,2-di(p-carboxyphenyl)ethane, 4,4'-dicarboxydiphenyl ether, 4,4'-bisbenzoic acid, or a combination comprising at least one of the foregoing acids. Acids containing fused rings can also be present, such as in 1,4-, 1,5-, or 2,6-naphthalenedicarboxylic acids. Specific dicarboxylic acids include terephthalic acid, isophthalic acid, naphthalene dicarboxylic acid, cyclohexane dicarboxylic acid, or a combination comprising at least one of the foregoing acids. A specific dicarboxylic acid comprises a combination of isophthalic acid and terephthalic acid wherein the weight ratio of isophthalic acid to terephthalic acid is 91:9 to 2:98. In another specific embodiment, J is a $C_{2-6}$ alkylene group and T is p-phenylene, m-phenylene, naphthalene, a divalent cycloaliphatic group, or a combination thereof. This class of polyester includes the poly(alkylene terephthalates).

The molar ratio of ester units to carbonate units in the copolymers can vary broadly, for example 1:99 to 99:1, specifically 10:90 to 90:10, more specifically 25:75 to 7525, depending on the desired properties of the final composition. In an embodiment, the molar ratio of ester units to carbonate units in the copolymers is less than 20:80.

In a specific embodiment, the polyester unit of a polyester-polycarbonate is derived from the reaction of a combination of isophthalic and terephthalic diacids (or derivatives thereof) with resorcinol. In another specific embodiment, the polyester unit of a polyester-polycarbonate is derived from the reaction of a combination of isophthalic acid and terephthalic acid with bisphenol A. In a specific embodiment, the polycarbonate units are derived from bisphenol A. In another specific embodiment, the polycarbonate units are derived from resorcinol and bisphenol A in a molar ratio of resorcinol carbonate units to bisphenol A carbonate units of 1:99 to 99:1.

Another type of copolymer is a polysiloxane-polycarbonate copolymer, also referred to as a polysiloxane-polycarbonate. The polysiloxane blocks of the copolymer comprise repeating diorganosiloxane units as in formula (10)

(10)

wherein each R is independently a $C_{1-13}$ monovalent organic group. For example, R can be a $C_1$-$C_{13}$ alkyl, $C_1$-$C_{13}$ alkoxy, $C_2$-$C_{13}$ alkenyl group, $C_2$-$C_{13}$ alkenyloxy, $C_3$-$C_6$ cycloalkyl, $C_3$-$C_6$ cycloalkoxy, $C_6$-$C_{14}$ aryl, $C_6$-$C_{10}$ aryloxy, $C_7$-$C_{13}$ arylalkyl, $C_7$-$C_{13}$ aralkoxy, $C_7$-$C_{13}$ alkylaryl, or $C_7$-$C_{13}$ alkylaryloxy. The foregoing groups can be fully or partially halogenated with fluorine, chlorine, bromine, or iodine, or a combination thereof. In an embodiment, where a transparent polysiloxane-polycarbonate is desired, R is unsubstituted by halogen. Combinations of the foregoing R groups can be used in the same copolymer.

The value of E in formula (10) can vary widely depending on the type and relative amount of each component in the polycarbonate composition, the desired properties of the composition, and like considerations. Generally, E has an average value of 2 to 1,000, specifically 2 to 500, or 2 to 200, more specifically 5 to 100. In an embodiment, E has an average value of 10 to 75, and in still another embodiment, E has an average value of 40 to 60. Where E is of a lower value, e.g., less than 40, it can be desirable to use a relatively larger amount of the polycarbonate-polysiloxane copolymer. Conversely, where E is of a higher value, e.g., greater than 40, a relatively lower amount of the polycarbonate-polysiloxane copolymer can be used.

A combination of a first and a second (or more) polycarbonate-polysiloxane copolymers can be used, wherein the average value of E of the first copolymer is less than the average value of E of the second copolymer.

In an embodiment, the polydiorganosiloxane blocks are of formula (11)

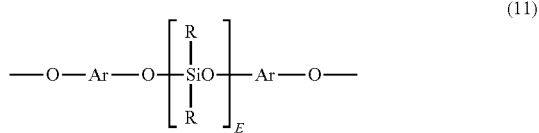

(11)

wherein E is as defined above; each R can be the same or different, and is as defined above; and Ar can be the same or different, and is a substituted or unsubstituted $C_6$-$C_{30}$ arylene group, wherein the bonds are directly connected to an aromatic moiety. Ar groups in formula (11) can be derived from a $C_6$-$C_{30}$ dihydroxyarylene compound, for example a dihydroxyarylene compound of formula (3) or (6) above. dihydroxyarylene compounds are 1,1-bis(4-hydroxyphenyl)methane, 1,1-bis(4-hydroxyphenyl)ethane, 2,2-bis(4-hydroxyphenyl)propane, 2,2-bis(4-hydroxyphenyl)butane, 2,2-bis(4-hydroxyphenyl)octane, 1,1-bis(4-hydroxyphenyl)propane, 1,1-bis(4-hydroxyphenyl) n-butane, 2,2-bis(4-hydroxy-1-methylphenyl)propane, 1,1-bis(4-hydroxyphenyl)cyclohexane, bis(4-hydroxyphenyl sulfide), and 1,1-bis(4-hydroxy-t-butylphenyl)propane. Combinations comprising at least one of the foregoing dihydroxy compounds can also be used.

In another embodiment, polydiorganosiloxane blocks are of formula (13)

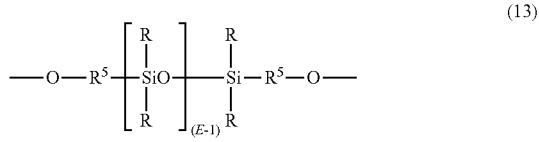

(13)

wherein R and E are as described above, and each $R^5$ is independently a divalent $C_1$-$C_{30}$ organic group, and wherein the polymerized polysiloxane unit is the reaction residue of its corresponding dihydroxy compound. In a specific embodiment, the polydiorganosiloxane blocks are of formula (14)

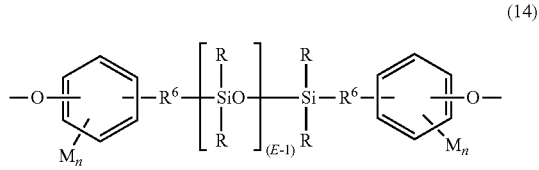

(14)

wherein R and E are as defined above. $R^6$ in formula (14) is a divalent $C_2$-$C_8$ aliphatic group. Each M in formula (14) can be the same or different, and can be a halogen, cyano, nitro, $C_1$-$C_8$ alkylthio, $C_1$-$C_8$ alkyl, $C_1$-$C_8$ alkoxy, $C_2$-$C_8$ alkenyl, $C_2$-$C_8$ alkenyloxy group, $C_3$-$C_8$ cycloalkyl, $C_3$-$C_8$ cycloalkoxy, $C_6$-$C_{10}$ aryl, $C_6$-$C_{10}$ aryloxy, $C_7$-$C_{12}$ aralkyl, $C_7$-$C_{12}$ aralkoxy, $C_7$-$C_{12}$ alkylaryl, or $C_7$-$C_{12}$ alkylaryloxy, wherein each n is independently 0, 1, 2, 3, or 4.

In an embodiment, M is bromo or chloro, an alkyl group such as methyl, ethyl, or propyl, an alkoxy group such as methoxy, ethoxy, or propoxy, or an aryl group such as phenyl, chlorophenyl, or tolyl; $R^2$ is a dimethylene, trimethylene or tetramethylene group; and R is a $C_{1-8}$ alkyl, haloalkyl such as trifluoropropyl, cyanoalkyl, or aryl such as phenyl, chlorophenyl or tolyl. In another embodiment, R is methyl, or a combination of methyl and trifluoropropyl, or a combination of methyl and phenyl. In still another embodiment, M is methoxy, n is one, $R^2$ is a divalent $C_1$-$C_3$ aliphatic group, and R is methyl.

The polyorganosiloxane-polycarbonate can comprise 50 to 99 weight percent (wt. %) of carbonate units and 1 to 50 wt. % siloxane units. Within this range, the polyorganosiloxane-polycarbonate copolymer can comprise 70 to 98 weight percent, more specifically 75 to 97 wt. % carbonate units and 2 to 30 weight percent, more specifically 3 to 25 wt. % siloxane units.

The bisphenol A polycarbonates can be manufactured by processes such as interfacial polymerization and melt polymerization. Although the reaction conditions for interfacial polymerization can vary, an interfacial process generally involves dissolving or dispersing a dihydric phenol reactant in aqueous caustic soda or potash, adding the resulting mixture to a water-immiscible solvent medium, and contacting the reactants with a carbonate precursor in the presence of a catalyst such as triethylamine and/or a phase transfer catalyst, under controlled pH conditions, e.g., 8 to 12. The most commonly used water immiscible solvents include methylene chloride, 1,2-dichloroethane, chlorobenzene, toluene, and the like.

Carbonate precursors include a carbonyl halide such as carbonyl bromide or carbonyl chloride, or a haloformate such as a bishaloformates of a dihydric phenol (e.g., the bischloroformates of bisphenol A, hydroquinone, or the like) or a glycol (e.g., the bishaloformate of ethylene glycol, neopentyl glycol, polyethylene glycol, or the like). Combinations comprising at least one of the foregoing types of carbonate precursors can also be used. In an embodiment, an interfacial polymerization reaction to form carbonate linkages uses phosgene as a carbonate precursor, and is referred to as a phosgenation reaction.

Among the phase transfer catalysts that can be used are catalysts of the formula $(R^3)_4Q^+X$, wherein each $R^3$ is the same or different, and is a $C_{1-10}$ alkyl group; Q is a nitrogen or phosphorus atom; and X is a halogen atom or a $C_{1-8}$ alkoxy group or $C_{6-18}$ aryloxy group. phase transfer catalysts include, for example, $[CH_3(CH_2)_3]_4NX$, $[CH_3(CH_2)_3]_4PX$, $[CH_3(CH_2)_5]_4NX$, $[CH_3(CH_2)_6]_4NX$, $[CH_3(CH_2)_4]_4NX$, $CH_3[CH_3(CH_2)_3]_3NX$, and $CH_3[CH_3(CH_2)_2]_3NX$, wherein X is Cl$^-$, Br$^-$, a $C_{1-8}$ alkoxy group or a $C_{6-18}$ aryloxy group. An effective amount of a phase transfer catalyst can be 0.1 to 10 wt. % based on the weight of bisphenol in the phosgenation mixture. In another embodiment an effective amount of phase transfer catalyst can be 0.5 to 2 wt. % based on the weight of bisphenol in the phosgenation mixture.

All types of polycarbonate end groups are contemplated as being useful in the polycarbonate composition, provided that such end groups do not significantly adversely affect desired properties of the compositions.

Branched polycarbonate blocks can be prepared by adding a branching agent during polymerization. These branching agents include polyfunctional organic compounds containing at least three functional groups such as hydroxyl, carboxyl, carboxylic anhydride, haloformyl, and mixtures of the foregoing functional groups. Specific examples include trimellitic acid, trimellitic anhydride, trimellitic trichloride, tris-p-hydroxy phenyl ethane, isatin-bis-phenol, tris-phenol TC (1,3,5-tris((p-hydroxyphenyl)isopropyl)benzene), tris-phenol PA (4(4(1,1-bis(p-hydroxyphenyl)-ethyl)alpha,alpha-dimethyl benzyl)phenol), 4-chloroformyl phthalic anhydride, trimesic acid, and benzophenone tetracarboxylic acid. The branching agents can be added at a level of 0.05 to 2.0 wt. %. Mixtures comprising linear polycarbonates and branched polycarbonates can be used.

A chain stopper (also referred to as a capping agent) can be included during polymerization. The chain stopper limits molecular weight growth rate, and so controls molecular weight in the polycarbonate. Chain stoppers include certain mono-phenolic compounds, mono-carboxylic acid chlorides, and/or mono-chloroformates. Mono-phenolic chain stoppers are exemplified by monocyclic phenols such as phenol and $C_1$-$C_{22}$ alkyl-substituted phenols such as p-cumyl-phenol, resorcinol monobenzoate, and p- and tertiary-butyl phenol; and monoethers of diphenols, such as p-methoxyphenol. Alkyl-substituted phenols with branched chain alkyl substituents having 8 to 9 carbon atom can be specifically mentioned. Certain mono-phenolic UV absorbers can also be used as a capping agent, for example 4-substituted-2-hydroxybenzophenones and their derivatives, aryl salicylates, monoesters of diphenols such as resorcinol monobenzoate, 2-(2-hydroxyaryl)-benzotriazoles and their derivatives, 2-(2-hydroxyaryl)-1,3,5-triazines and their derivatives, and the like.

Mono-carboxylic acid chlorides can also be used as chain stoppers. These include monocyclic, mono-carboxylic acid chlorides such as benzoyl chloride, $C_1$-$C_{22}$ alkyl-substituted benzoyl chloride, toluoyl chloride, halogen-substituted benzoyl chloride, bromobenzoyl chloride, cinnamoyl chloride, 4-nadimidobenzoyl chloride, and combinations thereof; polycyclic, mono-carboxylic acid chlorides such as trimellitic anhydride chloride, and naphthoyl chloride; and combinations of monocyclic and polycyclic mono-carboxylic acid chlorides. Chlorides of aliphatic monocarboxylic acids with less than or equal to 22 carbon atoms are useful. Functionalized chlorides of aliphatic monocarboxylic acids, such as acryloyl chloride and methacryoyl chloride, are also useful. Also useful are mono-chloroformates including monocyclic, mono-chloroformates, such as phenyl chloroformate, alkyl-substituted phenyl chloroformate, p-cumyl phenyl chloroformate, toluene chloroformate, and combinations thereof.

Alternatively, melt processes can be used to make the polycarbonates. Generally, in the melt polymerization process, polycarbonates can be prepared by co-reacting, in a molten state, the dihydroxy reactant and a diaryl carbonate ester, such as diphenyl carbonate, in the presence of a transesterification catalyst in a Banbury® mixer, twin-screw extruder, or the like to form a uniform dispersion. Volatile monohydric phenol is removed from the molten reactants by distillation and the polymer is isolated as a molten residue. A specifically useful melt process for making polycarbonates uses a diaryl carbonate ester having electron-withdrawing substituents on the aryls. Examples of specifically useful diaryl carbonate esters with electron withdrawing substituents include bis(4-nitrophenyl)carbonate, bis(2-chlorophenyl)carbonate, bis(4-chlorophenyl)carbonate, bis(methyl salicyl)carbonate, bis(4-methylcarboxylphenyl)carbonate, bis(2-acetylphenyl)carboxylate, bis(4-acetylphenyl)carboxylate, or a combination comprising at least one of the foregoing esters. In addition, useful transesterification catalysts can include phase transfer catalysts of formula $(R^3)_4Q^+X$, wherein each $R^3$, Q, and X are as defined above. Transesterification catalysts include tetrabutylammonium hydroxide, methyltributylammonium hydroxide, tetrabutylammonium acetate, tetrabutylphosphonium hydroxide, tetrabutylphosphonium acetate, tetrabutylphosphonium phenolate, or a combination comprising at least one of the foregoing.

The bisphenol A polycarbonates can have an intrinsic viscosity, as determined in chloroform at 25° C., of 0.3 to 1.5 deciliters per gram (dl/gm), specifically 0.45 to 1.0 dl/gm. The bisphenol A polycarbonates can have a weight average molecular weight of 10,000 to 200,000 Daltons, specifically 20,000 to 100,000 Daltons, as measured by gel permeation chromatography (GPC), using a crosslinked styrene-divinylbenzene column and calibrated to polycarbonate references. GPC samples are prepared at a concentration of 1 mg per ml, and are eluted at a flow rate of 1.5 ml per minute.

The bisphenol A polycarbonates can have a melt volume flow rate, measured at 300° C./1.2 kg, of 1 to 60 cubic centimeters per 10 minutes (cc/10 min), specifically 2 to 30 cc/10 min. Combinations of bisphenol A polycarbonates (optionally with other polycarbonates) of different flow properties can be used to achieve the overall desired flow property. In an embodiment, the polycarbonate has flow properties useful for the manufacture of thin articles.

In any of the embodiments herein, the bisphenol A polycarbonate comprises a branched bisphenol A polycarbonate having a branching level of greater than or equal to 0.1 wt. %, greater than or equal to 0.2 wt. %, greater than or equal to 0.3 wt. % greater than or equal to 0.35 wt. %, greater than or equal to 0.5 wt. %, greater than or equal to 1 wt. %, greater than or equal to 2 wt. %, or greater than or equal to 3 wt. %. For example, the bisphenol A polycarbonate can comprise a linear bisphenol A polycarbonate and a branched bisphenol A polycarbonate in any ratio. In an embodiment, a weight ratio of the linear bisphenol A polycarbonate to the branched bisphenol A polycarbonate is 3:7 to 6:4.

In addition to the bisphenol A polycarbonate described above, the polycarbonate composition can further include an additional polycarbonate that is different from the bisphenol A polycarbonate. The additional polycarbonate can be a homopolycarbonate derived from a bisphenol of formula (3) that is not bisphenol A; a polycarbonate copolymer derived from more than one bisphenol that is not bisphenol A; or a polycarbonate copolymer derived from a bisphenol that is not bisphenol A and comprising an aliphatic ester unit, an aromatic ester unit, a siloxane unit or a combination comprising at least one of the foregoing units. Combinations of the bisphenol A polycarbonate with other thermoplastic polymers, for example a polyesters can be used, provided that the polyester does not significantly adversely affect the desired properties of the composition. Useful polyesters can include, for example, polyesters having repeating units of formula (7), which include poly(alkylene dicarboxylates), liquid crystalline polyesters, and polyester copolymers. In an embodiment, only a polycarbonate polymer are used.

It has been found by the inventors hereof that the advantages described herein are obtained with use bisphenol A polycarbonates having specific additional properties. In an embodiment, the bisphenol A polycarbonate is manufactured via an interfacial process using a BPA monomer having both a high level of organic purity (e.g., measured by HPLC of greater than or equal to 99.65 wt %) and a sulfur level of less than or equal to 2 parts per million (ppm). The organic purity can be defined as 100 wt. % minus the sum of known and unknown impurities detected using ultraviolet (UV) (see HPLC method in Nowakowska et al., Polish J. Appl. Chem., XI(3), 247-254 (1996)). In addition, an end-capping agent is present during manufacture of the bisphenol A polycarbonate such that bisphenol A polycarbonate comprises a free hydroxyl level less than or equal to 150 ppm. Also, the sulfur level in the resultant BPA polycarbonate can be less than or equal to 2 ppm, as measured by a commercially available Total Sulfur Analysis based on combustion and coulometric detection. Bisphenol A polycarbonates of high purity, suitable for use in the present compositions, can also be manufactured via the melt process.

These bisphenol A polycarbonates are characterized by specific properties. In particular, the preferred bisphenol A polycarbonates have a low yellowness index and are heat stable. For example, a molded sample comprising the bisphenol A polycarbonate has a yellowness index (YI) of 2.5 or less, 2.0 or less, 1.5 or less, 1.2 or less, or 1.1 or less as measured by ASTM D1925. The bisphenol A polycarbonates can further be characterized by a molded sample thereof having an increase in YI (ΔYI) of less than 12, less than 12, or less than 10 after 5,000 hours of heat aging at 130° C. as measured by ASTM D1925. Alternatively, or in addition, the bisphenol A polycarbonates can have an increase in YI (ΔYI) of less than 3, less than 2.5, or less than 2 after 2,000 hours of heat aging at 130° C.

The preferred bisphenol A polycarbonates are also transparent in the absence of any light diffusers or other fillers. For example, a molded article of the polycarbonate composition has transmission level greater than or equal to 90.0% at 2.5 millimeter (mm) thickness as measured by ASTM D1003-00, Procedure A, measured, e.g., using a HAZE-GUARD DUAL from BYK-Gardner, using and integrating sphere (0°/diffuse geometry), wherein the spectral sensitivity conforms to the International Commission on Illumination (CIE) standard spectral value under standard lamp D65.

The polycarbonate compositions for use in LED lighting components can further optionally comprise light diffusers and flame retardants in addition to the bisphenol A polycarbonate.

Light diffusers, which are often used in the form of light diffusing particles, are used in the manufacture of articles that have good luminance, in which the article provides a high level of transmission of incident light (such as natural light through a window or skylight, or artificial light) with a minimum light loss by reflectance or scattering, where it is not desirable to either see the light source or other objects on the other side of the article. An article e.g., a sheet having a high degree of hiding power (i.e., luminance) allows a significant amount of light through, but is sufficiently diffusive so that a light source or image is not discernible through the panel. Light diffusers can be (meth)acrylic-based and include poly(alkyl acrylate)s and poly(alkyl methacrylate)s. Examples include poly(alkyl methacrylates), specifically poly(methyl methacrylate) (PMMA). Poly (tetrafluoroethylene) (PTFE) can be used. Light diffusers also include silicones such as poly(alkyl silsesquioxanes), for example poly(alkylsilsequioxane)s such as the poly (methylsilsesquioxane) available under the trade name TOSPEARL® from Momentive Performance Materials Inc. The alkyl groups in the poly(alkyl acrylate)s, poly(alkyl methacrylate)s and poly(alkylsilsequioxane)s can contain one to about twelve carbon atoms. Light diffusers can also be cross-linked. For example, PMMA can be crosslinked with another copolymer such as polystyrene or ethylene glycol dimethacrylate. In a specific embodiment, the polycarbonate composition comprises a light diffusing cross-linked poly(methyl methacrylate), poly(tetrafluoroethylene), poly(methylsilsesquioxane), or a combination comprising at least one of the foregoing.

Light diffusers also include certain inorganic materials, such as materials containing antimony, titanium, barium, and zinc, for example the oxides or sulfides of antimony, titanium, barium and zinc, or a combination containing at least one of the forgoing.

As the diffusing effect is dependent on the interfacial area between polymer matrix and the light diffuser, in particular the light diffusing particles, the particle size of the diffusers can less than or equal to 10 micrometers (μm). For example, the particle size of poly(alkylsilsequioxane)s such as poly (methylsilsesquioxane) can be 1.6 μm to 2.0 μm, and the particle size of crosslinked PMMA can be 3 μm to 6 μm.

Light diffusing particles can be present in the polycarbonate composition in an amount of 0 to 1.5%, specifically 0.001 to 1.5%, more specifically 0.2% to about 0.8% by weight based on the total weight of the composition. For example, poly(alkylsilsequioxane)s can be present in an amount of 0 to 1.5 wt. % based on the total weight of the composition, and crosslinked PMMA can be present in an amount of 0 to 1.5 wt. % based on the total weight of the composition.

Useful flame retardants include organic compounds that include phosphorus, bromine, and/or chlorine. Non-brominated and non-chlorinated phosphorus-containing flame retardants can be preferred in certain applications for regulatory reasons, for example organic phosphates and organic compounds containing phosphorus-nitrogen bonds.

One type of organic phosphate is an aromatic phosphate of the formula $(GO)_3P=O$, wherein each G is independently an alkyl, cycloalkyl, aryl, alkylaryl, or aralkyl group, provided that at least one G is an aromatic group. Two of the G groups can be joined together to provide a cyclic group, for example, diphenyl pentaerythritol diphosphate. aromatic phosphates include, phenyl bis(dodecyl)phosphate, phenyl bis(neopentyl)phosphate, phenyl bis(3,5,5'-trimethylhexyl) phosphate, ethyl diphenyl phosphate, 2-ethylhexyl di(p-tolyl)phosphate, bis(2-ethylhexyl) p-tolyl phosphate, tritolyl phosphate, bis(2-ethylhexyl)phenyl phosphate, tri(nonylphenyl)phosphate, bis(dodecyl) p-tolyl phosphate, dibutyl phenyl phosphate, 2-chloroethyl diphenyl phosphate, p-tolyl bis(2,5,5'-trimethylhexyl)phosphate, 2-ethylhexyl diphenyl phosphate, or the like. A specific aromatic phosphate is one in which each G is aromatic, for example, triphenyl phosphate, tricresyl phosphate, isopropylated triphenyl phosphate, and the like.

Di- or polyfunctional aromatic phosphorus-containing compounds are also useful, for example, compounds of the formulas below

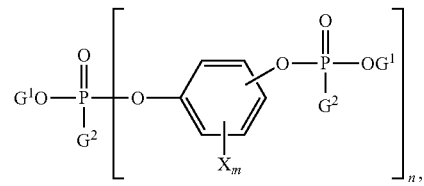

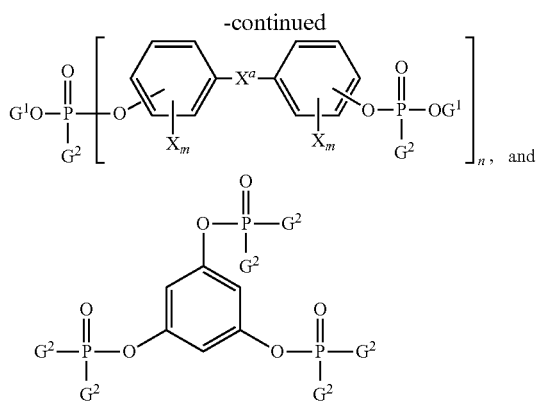

wherein each $G^1$ is independently a hydrocarbon having 1 to 30 carbon atoms; each $G^2$ is independently a hydrocarbon or hydrocarbonoxy having 1 to 30 carbon atoms; each X is independently a bromine or chlorine; m is 0 to 4, and n is 1 to 30. di- or polyfunctional aromatic phosphorus-containing compounds include resorcinol tetraphenyl diphosphate (RDP), the bis(diphenyl)phosphate of hydroquinone and the bis(diphenyl)phosphate of bisphenol A, respectively, their oligomeric and polymeric counterparts, and the like.

Flame retardant compounds containing phosphorus-nitrogen bonds include phosphonitrilic chloride, phosphorus ester amides, phosphoric acid amides, phosphonic acid amides, phosphinic acid amides, tris(aziridinyl)phosphine oxide. When present, phosphorus-containing flame retardants are generally present in amounts of 0.01 to 10 parts by weight, specifically 0.02 to 5 parts by weight, more specifically 0.02 to 1 part by weight based on 100 parts by weight of polycarbonate composition.

Halogenated materials can also be used as flame retardants, for example halogenated compounds and resins of formula (20)

(20)

wherein R is an alkylene, alkylidene or cycloaliphatic linkage, e.g., methylene, ethylene, propylene, isopropylene, isopropylidene, butylene, isobutylene, amylene, cyclohexylene, cyclopentylidene, or the like; or an oxygen ether, carbonyl, amine, or a sulfur containing linkage, e.g., sulfide, sulfoxide, sulfone, or the like. R can also consist of two or more alkylene or alkylidene linkages connected by such groups as aromatic, amino, ether, carbonyl, sulfide, sulfoxide, sulfone, or the like.

Ar and Ar' in formula (20) are each independently mono- or polycarbocyclic aromatic groups such as phenylene, biphenylene, terphenylene, naphthylene, or the like.

Y is an organic, inorganic, or organometallic radical, for example (1) halogen, e.g., chlorine, bromine, iodine, fluorine or (2) ether groups of the general formula OB, wherein B is a monovalent hydrocarbon group similar to X or (3) monovalent hydrocarbon groups of the type represented by R or (4) other substituents, e.g., nitro, cyano, and the like, said substituents being essentially inert provided that there is greater than or equal to one, specifically greater than or equal to two, halogen atoms per aryl nucleus.

When present, each X is independently a monovalent hydrocarbon group, for example an alkyl group such as methyl, ethyl, propyl, isopropyl, butyl, decyl, or the like; an aryl groups such as phenyl, naphthyl, biphenyl, xylyl, tolyl, or the like; and aralkyl group such as benzyl, ethylphenyl, or the like; a cycloaliphatic group such as cyclopentyl, cyclohexyl, or the like. The monovalent hydrocarbon group can itself contain inert substituents.

Each d is independently 1 to a maximum equivalent to the number of replaceable hydrogens substituted on the aromatic rings comprising Ar or Ar'. Each e is independently 0 to a maximum equivalent to the number of replaceable hydrogens on R. Each a, b, and c is independently a whole number, including 0. When b is not 0, neither a nor c can be 0. Otherwise either a or c, but not both, can be 0. Where b is 0, the aromatic groups are joined by a direct carbon-carbon bond.

The hydroxyl and Y substituents on the aromatic groups, Ar and Ar' can be varied in the ortho, meta or para positions on the aromatic rings and the groups can be in any possible geometric relationship with respect to one another.

Included within the scope of the above formula are bisphenols of which the following are representative 2,2-bis-(3,5-dichlorophenyl)-propane; bis-(2-chlorophenyl)-methane; bis(2,6-dibromophenyl)-methane; 1,1-bis-(4-iodophenyl)-ethane; 1,2-bis-(2,6-dichlorophenyl)-ethane; 1,1-bis-(2-chloro-4-iodophenyl)ethane; 1,1-bis-(2-chloro-4-methylphenyl)-ethane; 1,1-bis-(3,5-dichlorophenyl)-ethane; 2,2-bis-(3-phenyl-4-bromophenyl)-ethane; 2,6-bis-(4,6-dichloronaphthyl)-propane; 2,2-bis-(2,6-dichlorophenyl)-pentane; 2,2-bis-(3,5-dibromophenyl)-hexane; bis-(4-chlorophenyl)-phenyl-methane; bis-(3,5-dichlorophenyl)-cyclohexylmethane; bis-(3-nitro-4-bromophenyl)-methane; bis-(4-hydroxy-2,6-dichloro-3-methoxyphenyl)-methane; and 2,2-bis-(3,5-dichloro-4-hydroxyphenyl)-propane 2,2 bis-(3-bromo-4-hydroxyphenyl)-propane. Also included within the above structural formula are 1,3-dichlorobenzene, 1,4-dibromobenzene, 1,3-dichloro-4-hydroxybenzene, and biphenyls such as 2,2'-dichlorobiphenyl, polybrominated 1,4-diphenoxybenzene, 2,4'-dibromobiphenyl, and 2,4'-dichlorobiphenyl as well as decabromo diphenyl oxide, and the like.

Also useful are oligomeric and polymeric halogenated aromatic compounds, such as a copolycarbonate of bisphenol A and tetrabromobisphenol A and a carbonate precursor, e.g., phosgene. Metal synergists, e.g., antimony oxide, can also be used with the flame retardant. When present, halogen containing flame retardants are generally present in amounts of 0.01 to 10 parts by weight, specifically 0.02 to 5 parts by weight, more specifically 0.02 to 1 part by weight, based on 100 parts by weight of the polycarbonate composition.

Alternatively, the polycarbonate composition can be essentially free of chlorine and bromine. Essentially free of chlorine and bromine refers to materials produced without the intentional addition of chlorine or bromine or chlorine or bromine containing materials. It is understood however that in facilities that process multiple products a certain amount of cross contamination can occur resulting in bromine and/or chlorine levels typically on the parts per million by weight scale. With this understanding it can be readily appreciated that essentially free of bromine and chlorine can be defined as having a bromine and/or chlorine content of less than or equal to 100 parts per million by weight (ppm), less than or equal to 75 ppm, or less than or equal to 50 ppm. When this definition is applied to the fire retardant it is based on the total weight of the fire retardant. When this definition is applied to the polycarbonate composition it is based on the total weight of the composition, excluding any filler.

Inorganic flame retardants can also be used, for example salts of $C_{2-16}$ alkyl sulfonate salts such as potassium perfluorobutane sulfonate (Rimar salt), potassium perfluorooctane sulfonate, tetraethylammonium perfluorohexane sulfonate, and potassium diphenylsulfone sulfonate (KSS), and the like; salts formed by reacting for example an alkali metal or alkaline earth metal (for example lithium, sodium, potassium, magnesium, calcium and barium salts) and an inorganic acid complex salt, for example, an oxo-anion, such as alkali metal and alkaline-earth metal salts of carbonic acid, such as $Na_2CO_3$, $K_2CO_3$, $MgCO_3$, $CaCO_3$, and $BaCO_3$ or fluoro-anion complex such as $Li_3AlF_6$, $BaSiF_6$, $KBF_4$, $K_3AlF_6$, $KAlF_4$, $K_2SiF_6$, and/or $Na_3AlF_6$ or the like. When present, inorganic flame retardant salts are generally present in amounts of 0.01 to 10 parts by weight, specifically 0.02 to 5 parts by weight, more specifically 0.02 to 1 part by weight, based on 100 parts by weight of the polycarbonate composition. In an embodiment, a UL-95 rating of V-2 can be achieved using KSS, and a UL-95 rating of V-0 can be achieved using a Rimar salt.

Another useful type of flame retardant is a polysiloxane-polycarbonate copolymer as described above. E in formula (10) is selected so as to provide an effective level of flame retardance to the polycarbonate composition. The value of E will therefore vary depending on the type and relative amount of each component in the polycarbonate composition, including the type and amount of polycarbonate, impact modifier, polysiloxane-polycarbonate copolymer, and other flame retardants. Suitable values for E can be determined by one of ordinary skill in the art without undue experimentation using the guidelines taught herein. Generally, E has an average value of 2 to 1,000, specifically 10 to 100, more specifically 25 to 75. In an embodiment, E has an average value of 40 to 60, and in still another embodiment, E has an average value of 50. Where E is of a lower value, e.g., less than 40, it can be necessary to use a relatively larger amount of the polysiloxane-polycarbonate copolymer. Conversely, where E is of a higher value, e.g., greater than or equal to 40, it can be necessary to use a relatively smaller amount of the polysiloxane-polycarbonate copolymer. When present, the polysiloxane-polycarbonate copolymer can be used in amounts of 5 to 50 parts by weight, more specifically 10 to 40 parts by weight, based on 100 parts by weight of the polycarbonate composition.

In addition to the bisphenol A polycarbonate, light diffusers, and flame retardants, the polycarbonate composition can include various additives ordinarily incorporated into polymer compositions of this type, such as fillers, reinforcing agents, antioxidants, heat stabilizers, light stabilizers, ultraviolet (UV) light stabilizers, plasticizers, lubricants, mold release agents, antistatic agents, colorants such as organic dyes, surface effect additives, radiation stabilizers, and anti-drip agents, with the proviso that the additive is selected so as to not significantly adversely affect the desired properties of the polycarbonate composition, in particular light transmission, light diffusivity, and flame retardance. In addition to the foregoing additives, a light conversion material can optionally be present in the polycarbonate compositions. A combination of additives can be used, for example a combination of a heat stabilizer, mold release agent, and ultraviolet light stabilizer. In general, the additives are used in the amounts generally known to be effective.

Possible fillers or reinforcing agents include, for example, silicates and silica powders such as aluminum silicate (mullite), synthetic calcium silicate, zirconium silicate, fused silica, crystalline silica graphite, natural silica sand, or the like; boron powders such as boron-nitride powder, boron-silicate powders, or the like; oxides such as $TiO_2$, aluminum oxide, magnesium oxide, or the like; calcium sulfate (as its anhydride, dihydrate or trihydrate); calcium carbonates such as chalk, limestone, marble, synthetic precipitated calcium carbonates, or the like; talc, including fibrous, modular, needle shaped, lamellar talc, or the like; wollastonite; surface-treated wollastonite; glass spheres such as hollow and solid glass spheres, silicate spheres, cenospheres, aluminosilicate (armospheres), or the like; kaolin, including hard kaolin, soft kaolin, calcined kaolin, kaolin comprising various coatings known in the art to facilitate compatibility with the polymeric matrix resin, or the like; single crystal fibers or "whiskers" such as silicon carbide, alumina, boron carbide, iron, nickel, copper, or the like; fibers (including continuous and chopped fibers) such as asbestos, carbon fibers, glass fibers, such as E, A, C, ECR, R, S, D, or NE glasses, or the like; sulfides such as molybdenum sulfide, zinc sulfide or the like; barium compounds such as barium titanate, barium ferrite, barium sulfate, heavy spar, or the like; metals and metal oxides such as particulate or fibrous aluminum, bronze, zinc, copper and nickel or the like; flaked fillers such as glass flakes, flaked silicon carbide, aluminum diboride, aluminum flakes, steel flakes or the like; fibrous fillers, for example short inorganic fibers such as those derived from blends comprising at least one of aluminum silicates, aluminum oxides, magnesium oxides, and calcium sulfate hemihydrate or the like; natural fillers and reinforcements, such as wood flour obtained by pulverizing wood, fibrous products such as cellulose, cotton, sisal, jute, starch, cork flour, lignin, ground nut shells, corn, rice grain husks or the like; organic fillers such as polytetrafluoroethylene; reinforcing organic fibrous fillers formed from organic polymers capable of forming fibers such as poly(ether ketone), polyimide, polybenzoxazole, poly(phenylene sulfide), polyesters, polyethylene, aromatic polyamides, aromatic polyimides, polyetherimides, polytetrafluoroethylene, acrylic resins, poly(vinyl alcohol) or the like; as well as additional fillers and reinforcing agents such as mica, clay, feldspar, flue dust, fillite, quartz, quartzite, perlite, tripoli, diatomaceous earth, carbon black, or the like, or combinations comprising at least one of the foregoing fillers or reinforcing agents.

The fillers and reinforcing agents can be coated with a layer of metallic material to facilitate conductivity, or surface treated with silanes to improve adhesion and dispersion with the polymeric matrix resin. In addition, the reinforcing fillers can be provided in the form of monofilament or multifilament fibers and can be used individually or in combination with other types of fiber, through, for example, co-weaving or core/sheath, side-by-side, orange-type or matrix and fibril constructions, or by other methods known to one skilled in the art of fiber manufacture. Co-woven structures include glass fiber-carbon fiber, carbon fiber-aromatic polyimide (aramid) fiber, and aromatic polyimide fiberglass fiber or the like. Fibrous fillers can be supplied in the form of, for example, rovings, woven fibrous reinforcements, such as 0-90 degree fabrics or the like; non-woven fibrous reinforcements such as continuous strand mat, chopped strand mat, tissues, papers and felts or the like; or three-dimensional reinforcements such as braids. Fillers are generally used in amounts of 0 to 20 parts by weight, specifically 0.01 to 10 parts by weight, based on 100 parts by weight of the polycarbonate composition.

Antioxidant additives include organophosphites such as tris(nonyl phenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis[methylene(3,5-di-tert-butyl-4-hydroxyhydrocinnamate)]methane, or the like; butylated reaction products of para-cresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl) propionate or the like; amides of beta-(3,5-di-tert-butyl-4-hydroxyphenyl)-propionic acid or the like, or combinations comprising at least one of the foregoing antioxidants. Antioxidants are generally used in amounts of 0.0001 to 1 part by weight, based on 100 parts by weight of polycarbonate composition.

Heat stabilizer additives include organophosphites such as triphenyl phosphite, tris-(2,6-dimethylphenyl)phosphite, tris-(mixed mono- and di-nonylphenyl)phosphite or the like; phosphonates such as dimethylbenzene phosphonate or the like, phosphates such as trimethyl phosphate, or the like, or combinations comprising at least one of the foregoing heat stabilizers. Heat stabilizers are generally used in amounts of 0.0001 to 1 part by weight, based on 100 parts by weight of polycarbonate composition.

Light stabilizers and/or ultraviolet light (UV) absorbing additives that do not have a hydroxyl group can also be used. Light stabilizers are generally used in amounts of 0.0001 to 1 part by weight, specifically 0.001 to 0.1 part by weight, more specifically 0.01 to 0.1 part by weight, based on 100 parts by weight of the polycarbonate composition.

Plasticizers, lubricants, and/or mold release agents can also be used. There is considerable overlap among these types of materials, which include, for example, phthalic acid esters such as dioctyl-4,5-epoxy-hexahydrophthalate; tris-(octoxycarbonylethyl)isocyanurate; tristearin; di- or polyfunctional aromatic phosphates such as resorcinol tetraphenyl diphosphate (RDP), the bis(diphenyl)phosphate of hydroquinone and the bis(diphenyl)phosphate of bisphenol A; poly-alpha-olefins; epoxidized soybean oil; silicones, including silicone oils; esters, for example, fatty acid esters such as alkyl stearyl esters, e.g., methyl stearate, stearyl stearate, pentaerythritol tetrastearate, and the like; combinations of methyl stearate and hydrophilic and hydrophobic nonionic surfactants comprising polyethylene glycol polymers, polypropylene glycol polymers, poly(ethylene glycol-co-propylene glycol) copolymers, or a combination comprising at least one of the foregoing glycol polymers, e.g., methyl stearate and polyethylene-polypropylene glycol copolymer in a suitable solvent; waxes such as beeswax, montan wax, paraffin wax, or the like. Such materials are generally used in amounts of 0.001 to 1 part by weight, based on 100 parts by weight of the polycarbonate composition.

The term "antistatic agent" refers to monomeric, oligomeric, or polymeric materials that can be processed into polymer resins and/or sprayed onto materials or articles to improve conductive properties and overall physical performance. Examples of monomeric antistatic agents include glycerol monostearate, glycerol distearate, glycerol tristearate, ethoxylated amines, primary, secondary and tertiary amines, ethoxylated alcohols, alkyl sulfates, alkylarylsulfates, alkylphosphates, alkylaminesulfates, alkyl sulfonate salts such as sodium stearyl sulfonate, sodium dodecylbenzenesulfonate or the like, quaternary ammonium salts, quaternary ammonium resins, imidazoline derivatives, sorbitan esters, ethanolamides, betaines, or the like, or combinations comprising at least one of the foregoing monomeric antistatic agents.

Polymeric antistatic agents include certain polyesteramides polyether-polyamide (polyetheramide) block copolymers, polyetheresteramide block copolymers, polyetheresters, or polyurethanes, each containing polyalkylene glycol moieties polyalkylene oxide units such as polyethylene glycol, polypropylene glycol, polytetramethylene glycol, and the like. Such polymeric antistatic agents are commercially available, for example PELESTAT® 6321 (Sanyo) or PEBAX® MH1657 (Atofina), IRGASTAT® P18 and P22 (Ciba-Geigy). Other polymeric materials that can be used as antistatic agents are inherently conducting polymers such as polyaniline (commercially available as PANIPOL®EB from Panipol), polypyrrole and polythiophene (commercially available from Bayer), which retain some of their intrinsic conductivity after melt processing at elevated temperatures. In an embodiment, carbon fibers, carbon nanofibers, carbon nanotubes, carbon black, or a combination comprising at least one of the foregoing can be used in a polymeric resin containing chemical antistatic agents to render the composition electrostatically dissipative. Antistatic agents are generally used in amounts of 0.0001 to 5 parts by weight, based on 100 parts by weight of the polycarbonate composition.

Colorants such as pigment and/or dye additives can also be present. Useful pigments can include, for example, inorganic pigments such as metal oxides and mixed metal oxides such as zinc oxide, titanium dioxides, iron oxides, or the like; sulfides such as zinc sulfides, or the like; aluminates; sodium sulfo-silicates sulfates, chromates, or the like; carbon blacks; zinc ferrites; ultramarine blue; organic pigments such as azos, di-azos, quinacridones, perylenes, naphthalene tetracarboxylic acids, flavanthrones, isoindolinones, tetrachloroisoindolinones, anthraquinones, enthrones, dioxazines, phthalocyanines, and azo lakes; Pigment Red 101, Pigment Red 122, Pigment Red 149, Pigment Red 177, Pigment Red 179, Pigment Red 202, Pigment Violet 29, Pigment Blue 15, Pigment Blue 60, Pigment Green 7, Pigment Yellow 119, Pigment Yellow 147, Pigment Yellow 150, and Pigment Brown 24; or combinations comprising at least one of the foregoing pigments. Pigments, when present, are generally used in amounts of 0.0001 to 1 part by weight, based on 100 parts by weight of the polycarbonate composition.

Dyes are generally organic materials and include coumarin dyes such as coumarin 460 (blue), coumarin 6 (green), nile red or the like; lanthanide complexes; hydrocarbon and substituted hydrocarbon dyes; polycyclic aromatic hydrocarbon dyes; scintillation dyes such as oxazole or oxadiazole dyes; aryl- or heteroaryl-substituted poly($C_{2-8}$) olefin dyes; carbocyanine dyes; indanthrone dyes; phthalocyanine dyes; oxazine dyes; carbostyryl dyes; napthalenetetracarboxylic acid dyes; porphyrin dyes; bis(styryl)biphenyl dyes; acridine dyes; anthraquinone dyes; cyanine dyes; methine dyes; arylmethane dyes; azo dyes; indigoid dyes, thioindigoid dyes, diazonium dyes; nitro dyes; quinone imine dyes; aminoketone dyes; tetrazolium dyes; thiazole dyes; perylene dyes, perinone dyes; bis-benzoxazolylthiophene (BBOT); triarylmethane dyes; xanthene dyes; thioxanthene dyes; naphthalimide dyes; lactone dyes; fluorophores such as anti-stokes shift dyes which absorb in the near infrared wavelength and emit in the visible wavelength, or the like; luminescent dyes such as 7-amino-4-methylcoumarin; 3-(2'-benzothiazolyl)-7-diethylaminocoumarin; 2-(4-biphenylyl)-5-(4-t-butylphenyl)-1,3,4-oxadiazole; 2,5-bis-(4-biphenylyl)-oxazole; 2,2'-dimethyl-p-quaterphenyl; 2,2-dimethyl-p-terphenyl; 3,5,3"",5""-tetra-t-butyl-p-quinquephenyl; 2,5-diphenylfuran; 2,5-diphenyloxazole; 4,4'-diphenylstilbene; 4-dicyanomethylene-2-methyl-6-(p-dimethylaminostyryl)-4H-pyran; 1,1'-diethyl-2,2'-carbocyanine iodide; 3,3'-diethyl-4,4',5,5'-dibenzothiatricarbocyanine iodide; 7-dimethylamino-1-methyl-4-methoxy-8-azaquinolone-2; 7-dimethylamino-4-methylquinolone-2; 2-(4-(4-dimethylaminophenyl)-1,3-butadienyl)-3-ethylbenzothiazolium perchlorate; 3-diethylamino-7-diethyliminophenoxazonium perchlorate; 2-(1-naphthyl)-5-phenyloxazole; 2,2'-p-phenylen-bis(5-phenyloxazole); rhodamine 700; rhodamine 800; pyrene, chrysene, rubrene, coronene, or the like; or combinations comprising at least one of the foregoing dyes. Dyes are generally used in amounts of 0.0001 to 1 part by weight, specifically 0.001 to 0.5 part by weight, based on 100 parts by weight of the polycarbonate composition.

Anti-drip agents can also be used in the composition, for example a fibril forming or non-fibril forming fluoropolymer such as polytetrafluoroethylene (PTFE). The anti-drip agent can be encapsulated by a rigid copolymer as described above, for example styrene-acrylonitrile copolymer (SAN). PTFE encapsulated in SAN is known as TSAN. Encapsulated fluoropolymers can be made by polymerizing the encapsulating polymer in the presence of the fluoropolymer, for example an aqueous dispersion. TSAN can provide significant advantages over PTFE, in that TSAN can be more readily dispersed in the composition. An TSAN can comprise 50 wt. % PTFE and 50 wt. % SAN, based on the total weight of the encapsulated fluoropolymer. The SAN can comprise, for example, 75 wt. % styrene and 25 wt. % acrylonitrile based on the total weight of the copolymer. Alternatively, the fluoropolymer can be pre-blended in some manner with a second polymer, such as for, example, an aromatic polycarbonate or SAN to form an agglomerated material for use as an anti-drip agent. Either method can be used to produce an encapsulated fluoropolymer. Antidrip agents are generally used in amounts of 0.1 to 5 percent by weight, based on 100 percent by weight of the polycarbonate composition.

Radiation stabilizers can also be present, specifically gamma-radiation stabilizers. gamma-radiation stabilizers include alkylene polyols such as ethylene glycol, propylene glycol, 1,3-propanediol, 1,2-butanediol, 1,4-butanediol, meso-2,3-butanediol, 1,2-pentanediol, 2,3-pentanediol, 1,4-pentanediol, 1,4-hexandiol, and the like; cycloalkylene polyols such as 1,2-cyclopentanediol, 1,2-cyclohexanediol, and the like; branched alkylenepolyols such as 2,3-dimethyl-2,3-butanediol (pinacol), and the like, as well as alkoxy-substituted cyclic or acyclic alkanes. Unsaturated alkenols are also useful, examples of which include 4-methyl-4-penten-2-ol, 3-methyl-pentene-3-ol, 2-methyl-4-penten-2-ol, 2,4-dimethyl-4-pene-2-ol, and 9-decen-1-ol, as well as tertiary alcohols that have at least one hydroxy substituted tertiary carbon, for example 2-methyl-2,4-pentanediol (hexylene glycol), 2-phenyl-2-butanol, 3-hydroxy-3-methyl-2-butanone, 2-phenyl-2-butanol, and the like, and cyclic tertiary alcohols such as 1-hydroxy-1-methyl-cyclohexane. Certain hydroxymethyl aromatic compounds that have hydroxy substitution on a saturated carbon attached to an unsaturated carbon in an aromatic ring can also be used. The hydroxy-substituted saturated carbon can be a methylol group ($-CH_2OH$) or it can be a member of a more complex hydrocarbon group such as $-CR^4HOH$ or $-CR_2^4OH$ wherein $R^4$ is a complex or a simple hydrocarbon. Specific hydroxy methyl aromatic compounds include benzhydrol, 1,3-benzenedimethanol, benzyl alcohol, 4-benzyloxy benzyl alcohol and benzyl benzyl alcohol. 2-Methyl-2,4-pentanediol, polyethylene glycol, and polypropylene glycol are often used for gamma-radiation stabilization. Gamma-radiation stabilizing compounds are typically used in amounts of 0 to 1 part by weight based on 100 parts by weight of the polycarbonate composition. In an embodiment, the polycarbonate composition does not contain radiation stabilizers having hydroxyl functional groups.

Various types of conversion materials can be present in the polycarbonate compositions. The conversion materials are selected and added in an effective quantity so as to facilitate luminescence or transmission of an LED or other light-emitting device. Depending upon how a conversion material is made, it may be long-lived (luminescence lifetime of greater than minutes) or short-lived. Some useful conversion materials have a short-lived luminescence lifetime of less than $10^{-4}$ second.

The conversion material can be coated (e.g., result of applying a material to the surface of the conversion material, wherein the coating is on the surface and/or chemically interacts with the surface). Radiometric values (such as radiant power, radiant intensity, irradiance, and radiance) and corresponding photometric values (such as total luminance flux, luminous intensity, illuminance, luminance), luminance efficacy (in lumens per watt (lm/W)), color rendering index, color quality scale (CQS), correlated color temperature, and chromaticity, are expected to improve compared to the uncoated conversion material when added to a plastic material such as polycarbonate. Desirably, the conversion material can be sufficiently coated so as to maintain melt stability with an MVR change of less than or equal to 30%, specifically less than or equal to 10% (i.e., MVR is determined at 6 minutes and again at 18 minutes, and the difference between these MVRs is less than or equal to 30% of the 6 minute value).

The conversion material can be coated with silicone oil or a layer of amorphous silica. Some examples of silicone oils are hydrogen-alkyl siloxane oil (e.g., polymethylhydroxysiloxane such as DF1040, commercially available from Momentive Performance Materials); polydialkyl siloxane oil (e.g., polydimethylsiloxane such as DF581 commercially available from Momentive Performance Materials); poly (dimethyl siloxane-co-diphenyl siloxane), dihydroxy-terminated silicone oils (e.g., silanol terminated diphenylsiloxane such as Gelest PDS 1615 commercially available from Gelest, Inc.); as well as combinations comprising at least one of the foregoing. Such silicone oils are considered coatings where the conversion material is first treated with the silicone oil prior to addition to the polycarbonate matrix or binder (collectively referred to as matrix). The coating itself is neither the binder nor the matrix that contains the conversion material. The conversion material can be coated with silicone oil by a variety of methods, e.g., by spraying the silicon oil. For example, the conversion material can be coated by spraying of the silicone oil in a fluidized bed reactor. The total amount of silicone oil can be 0.05 wt. % to 20 wt. % with respect to the conversion material, specifically, 0.1 wt. % to 10 wt %, and more specifically, 0.5 wt. % to 5 wt %, based upon the total weight of the conversion material. When two silicone coatings are used, such as polymethylhydroxysiloxane and polydimethylsiloxane, the total amount does not change, and the split ratio between the two oils can be 1:99 to 99:1 depending on the type of protection being sought. In an embodiment, the first coating represents at least about 50 wt. % of the total silicone oil content. Coating of the conversion materials is further described in commonly assigned U.S. Pat. No. 6,692,659 B2 to Brown et al.

The conversion material, including those of which are surface treated, can include a conversion material having the formula $(A^3)_2SiO_4$:$Eu^{2+}D^1$ where $A^3$ is a divalent metal such as Sr, Ca, Ba, Mg, Zn, Cd, and combinations comprising at least one of the foregoing, and $D^1$ is a dopant such as F, Cl, Br, I, P, S or N, and optionally combinations comprising at least one of the foregoing; a material having the formula $(A^4)_2SiO_4$:$Eu^{2+}D^2$ with an optional dopant suc as Al, Co, Fe, Mg, Mo, Na, Ni, Pd, P, Rh, Sb, Ti or Zr, and optionally combinations comprising at least one of the foregoing, wherein $A^4$ is Sr, Ba, Ca, and combinations comprising at least one of the foregoing; a material having the formula $(YA^5)_3(AlB)_5(OD^3)_{12}$:$Ce^{3+}$ where $A^5$ is a trivalent metal such as Gd, Tb, La, Sm, or a divalent metal ion such as Sr, Ca, Ba, Mg, Zn, Cd, and combinations comprising at least one of the foregoing; B is Si, B, P, and Ga, and optionally combinations comprising at least one of the foregoing; and $D^3$ is a dopant F, Cl, Br, I, P, S or N, and optionally combinations comprising at least one of the foregoing. Other possible yellow conversion material include $Y_3Al_5O_{12}$:Ce; $Tb_{3-x}RE_xAl_5O_{12}$:Ce (TAG), wherein RE=Y, Gd, La, Lu; and $Sr_{2-x-y}Ba_xCa_ySiO_4$:Eu; $Sr_{3-x}SiO_5$:$Eu^{2+}{}_x$, wherein $0<x\leq1$. Possible yellow/green conversion materials include $(Sr,Ca,Ba)(Al,Ga)_2S_4$:$Eu^{2+}$; $Ba_2(Mg,Zn)Si_2O_7$:$Eu^{2+}$; $Gd_{0.46}Sr_{0.31}Al_{1.23}O_xF_{1.38}$:$Eu^{2+}{}_{0.06}$; $(Ba_{1-x-y}Sr_xCa_y)SiO_4$:Eu; and $Ba_2SiO_4$:$Eu^{2+}$.

The conversion material can be a material having the formula $(YGd)_3Al_5O_{12}$:$Ce^3$ or $Y_3Al_5(OD^3)_{12}$:$Ce^{3+}$; an orange-red silicate-based conversion material having the formula $SrM1)_3Si(OD^4)_5$:Eu where M1 is Ba, Ca, Mg, Zn, and combinations comprising at least one of the foregoing and $D^4$ is F, Cl, S, and N, and optionally combinations comprising at least one of the foregoing; conversion material; a $Eu^{2+}$-doped and or $Dy^{3+}$-conversion material having the formula $M_3MgSi_2O_8$ wherein M is Ca, Sr, Ba and combinations comprising at least one of the foregoing; a red silicon nitride based $Eu^{2+}$ doped conversion material having the formula $(SrM2)_2Si_5N_8$ where M2 is Ca, Mg, and Zn; a nitridosilicate, oxonitridosilicate, or oxonitridoaluminosilicate such as $Ba_2SiN_8$:$Eu^{2+}$; alpha-SiAlON:Re (where Re=$Eu^{2+}$, $Ce^{3+}$, $Yb^{2+}$, $Tb^{3+}$, $Pr^{3+}$, $Sm^{3+}$, and optionally combinations comprising at least one of the foregoing); Beta-SiAlON:$Eu^{2+}$; $Sr_2Si_5N_8$:$Eu^{2+}$,$Ce^{3+}$; a rare earth-doped red sulfate based conversion material having the formula (SrM3)S where M3 is Ca, Ba, and Mg, and optionally combinations comprising at least one of the foregoing; red conversion materials such as $Sr_xCa_{1-x}S$:Eu,Y, wherein Y is a halide; $CaSiAlN_3$:$Eu^{2+}$; $Sr_{2-y}Ca_ySiO_4$:Eu; $Lu_2O_3$:$Eu^{3+}$; $(Sr_{2-x}La_x)(Ce_{1-x}Eu_x)O_4$; $Sr_2Ce_{1-x}Eu_xO_4$; $Sr_{2-x}Eu_xCeO_4$; $SrTiO_3$:$Pr^{3+}$,$Ga^{3+}$; $CaAlSiN_3$:$Eu^{2+}$; and $Sr_2Si_5N_8$:$Eu^{2+}$. The conversion material can comprise blue conversion material, e.g., having the formula $BaMgAl_{10}O_{17}$:$Eu^{2+}$. The conversion material can comprise green sulfate-based conversion materials, e.g., having the formula $(SrM3)(GaM4)_2S_4$:Eu where M3 is set forth above, and M4 is Al or In. Other conversion materials can include $Tb_{3-x}RE^1{}_xO_{12}$:Ce(TAG), wherein $RE^1$ is Y, Gd, La, Lu, and combinations comprising at least one of the foregoing; yttrium aluminum garnet (YAG) doped with cerium (e.g., $(Y,Gd)_3Al_5O_{12}$:$Ce^{3+}$; YAG:Ce); terbium aluminum garnet doped with cerium (TAG:Ce); silicate conversion material (BOSE), (e.g. $(Sr)_2SiO_4$:Eu, $(Ba)_2SiO_4$:Eu, or $(Ca)_2SiO_4$:Eu); nitride conversion material (e.g., doped with cerium and/or europium); nitrido silicates (e.g., $LaSi_3N_5$:$Eu^{2+}$, $O^{2-}$ or $Ba_2Si_5N_8$:$Eu^{2+}$); nitride orthosilicate (e.g., such as disclosed in DE 10 2006 016 548 A1); or combinations comprising at least one of the foregoing. Other possible green conversion materials include $SrGa2S_4$:Eu, $Sr_{2-y}BaySiO_4$:Eu, $SrSiO_2N_2$:Eu, and $Ca_3Si_2O_4N_2$:$Eu^{2+}$.

The various conversion materials (e.g., coated conversion materials) described above can be used alone or in combination. The conversion material can comprise combinations of a yellow conversion material (such as $(Y,Gd)_3Al_5O_{12}$:$Ce^{3+}$ or $(Sr,Ba,Ca)_2SiO_4$:Eu) with a red conversion material (such as $(Sr, Ca)AlSiN_3$:Eu), e.g., to produce a warm white light. The conversion material can comprise a combination of green aluminate (GAL) and a red conversion material (e.g., to produce white light from the RGB of blue LED, green light and red light). Green aluminate and red nitride conversion materials can be used alone or combined to generate white light when exposed to blue LED light. Red nitride conversion material may contain ions to promote quantum efficiency. The conversion material can comprise a combination of a semiconductor nanocrystals of cadmium sulfide mixed with manganese; and/or a $La_3Si_6N_{11}$:$Ce^{3+}$. A YAG:Ce conversion material or BOSE (boron ortho-silicate) conversion material, for example, can be utilized to convert the blue light to yellow. A reddish AlInGaP LED can be included to pull yellow light from the conversion material to the black body curve. The YAG:Ce based conversion material can be synthetic aluminum garnets, with garnet structure $A_3^{3+}B_5^{3+}O_{12}^{2-}$ (containing $Al_5O_{12}^{9-}$ and A is a trivalent element such as $Y^{3+}$). Specifically, in some embodiments, the conversion material is not an aluminum spinel, wherein a spinel has the structure $A^{2+}B_2^{3+}O_4^{2-}$ ($Al_2O_4^{2-}$ and A is a divalent alkaline earth element such as $Ca^{2+}$, $Sr^{2+}$, and $Ba^{2+}$). The aluminum garnet is synthetically prepared in such a manner (annealing) as to impart short-lived luminescence lifetime lasting less than $10^{-4}$s. Another process for forming short-lived luminescence (i.e., avoiding forming long afterglow materials) is disclosed in *Advanced Powder Technology* to Shii Choua et al., Volume 23, Issue 1, January 2012, Pages 97-103.

The amount of the conversion material can vary depending on the particular material and the desired properties. For example, the conversion material can be added to the polycarbonate composition in an amount of 0.1 to 40 parts by weight (pbw) of the conversion material based on 100 pbw of the polycarbonate composition, specifically, 4 to 20 pbw of the conversion material to 100 pbw of the polycarbonate composition.

The conversion material can have a median particle size of 10 nanometers (nm) to 100 micrometers (μm), as determined by laser diffraction. The median particle size is sometimes indicated as $D_{50}$-value. The median particle size can be 1 to 30 micrometers, specifically, 5 to 25 micrometers. Examples of median particle sizes include 1 to 5 micrometers, 6 to 10 micrometers, 11 to 15 micrometers, 16 to 20 micrometers, 21 to 25 micrometers, 26 to 30 micrometers, or 31 to 100 micrometers, or larger.

The polycarbonate composition comprising the conversion material can take many different shapes. For example, the polycarbonate composition comprising the conversion material can have more or fewer bends such that it is U-shaped or V-shaped, or can have different bends with different radiuses of curvature. There can be multiple bends in different locations and different embodiments the polycarbonate composition comprising the coated conversion material can take more complex compound shapes. The polycarbonate composition comprising the conversion material can be rounded or polygonal, for example, the shape can be circular, oval, rectangular, square, pentagon, hexagon, octagon, etc., and/or it can have a more complex shape such as those illustrated in U.S. Patent Publication No. 2011/0140593 to Negley et al. Examples of some more complex shapes include hyperbolic paraboloid shapes, such as doubly ruled surface shaped like a saddle. Desirably, the radius of curvature for the different sections is such that there are no facing surfaces or the number of facing surfaces is minimized. The shape is generally open when viewed from the top. It is understood that the polycarbonate composition comprising the conversion material can take many different compound shapes beyond those described above. For example, a generally open shape comprising multiple edges and surfaces with different radiuses of curvature. The polycarbonate composition can also have different characteristics to provide the desired emission pattern from the lamp. In some embodiments, the conversion material layer can have regions with different thickness, with the sections of greater thickness presenting more conversion material for the light to pass through. In other embodiments the article (e.g., housing) formed from the composition can have different concentrations of the conversion materials in different regions. In other embodiments, the polycarbonate composition can also have more than one conversion material mixed throughout, or can have different regions of different conversion materials. The conversion material can also have dispersing agents arranged throughout, or dispersing agents arranged in different concentrations in different regions. The polycarbonate composition can also have regions that are substantially transparent.

In an embodiment, the polycarbonate composition comprises 90 to 99.9 wt. % of the bisphenol A polycarbonate; 0 to 1.5 wt. % of light diffusing particles; and 0.001 to 1 wt. % of 2,2'-(1,4-phenylene)bis(4H-3,1-benzoxazin-4-one). In another embodiment, the polycarbonate composition comprises 95 to 99.8 wt. % bisphenol A polycarbonate, 0.001 to 1.5 wt. % light diffusing particles; and 0.01 to 0.5 wt. % 2,2'-(1,4-phenylene)bis(4H-3,1-benzoxazin-4-one). In another embodiment, the polycarbonate composition comprises 95 to 99.8 wt. % bisphenol A polycarbonate; 0.001 to 0.8 wt. % diffusing particles; and 0.05 to 0.5 wt. % 2,2'-(1,4-phenylene)bis(4H-3,1-benzoxazin-4-one). All of the foregoing wt. % values are based on the combined weight of the bisphenol A polycarbonate, the diffusing particles, and the 2,2'-(1,4-phenylene)bis(4H-3,1-benzoxazin-4-one). The polycarbonate composition can also comprise 0.02 to 5 wt. % of a flame retardant, and 0.0001 to 1 wt. % of a colorant.

The polycarbonate compositions can be manufactured by various methods. For example, powdered bisphenol A polycarbonate, flame retardants, light diffusing particles, and/or other optional components are first blended, optionally with fillers in a HENSCHEL-Mixer® high speed mixer. Other low shear processes, including but not limited to hand mixing, can also accomplish this blending. The blend is then fed into the throat of a twin-screw extruder via a hopper. Alternatively, at least one of the components can be incorporated into the composition by feeding directly into the extruder at the throat and/or downstream through a side stuffer. Additives can also be compounded into a masterbatch with a desired polymeric resin and fed into the extruder. The extruder is generally operated at a temperature higher than that necessary to cause the composition to flow. The extrudate is immediately quenched in a water batch and pelletized. The pellets, so prepared, when cutting the extrudate can be one-fourth inch long or less as desired. Such pellets can be used for subsequent molding, shaping, or forming.

A molded sample of the polycarbonate composition (i.e., the bisphenol A polycarbonate, UV absorbing agent, optional flame retardant, and other optional additives such as a stabilizer, antioxidant, and mold release agent) but without any light diffuser, have a YI of 2 or less, 1.5 or less, or 1.1 or less as measured by ASTM D1925. When a light diffuser is present, depending on the type and amount of light diffuser, a molded sample of the polycarbonate composition can have a have a YI of 15 or less, 13 or less, 12 or less, or 10 or less as measured by ASTM D1925.

A further advantage of using UV3638 is that it can be present in the compositions in higher amounts than UV absorbers such as UV5411, without causing a significant increase in the YI of the compositions before aging or weathering. As shown in Example 2 below, increasing the amount of UV5411 in the polycarbonate composition increases the initial YI of the polycarbonate composition over a range of 0 to 0.3 wt %. Increasing the amount of the UV3638 over a range of 0 to 0.3 wt. % results in a smaller increase in the initial YI of the polycarbonate composition, particularly in an interfacially polymerized polycarbonate manufactured from bisphenol A having a purity of greater than or equal to 99.65 wt. % and a sulfur content of less than or equal to 2 ppm. Accordingly, in an embodiment, the polycarbonate composition can have UV3638 present in an amount of 0.1 to 1 wt %, 0.12 to 1 wt %, 0.15 to 1 wt %, 0.2 to 1 wt %, 0.3 to 1 wt %, 0.4 to 1 wt %, 0.5 to 1 wt %, or 0.6 to 1 wt %, each based on the total weight of the polycarbonate composition.

A molded sample of the polycarbonate composition having a thickness of 2.5 mm can have an increase in YI ($\Delta$YI) of less than 12, less than 11.5, less than 11, less than 10.5, or less than 10 after 5,000 hours of heat aging at 130° C., as measured by ASTM D1925. Alternatively, or in addition, a molded sample of the polycarbonate composition having a thickness of 2.5 mm can have an increase in YI ($\Delta$YI) of less than 3, less than 2.5, or less than 2 after 2,000 hours of heat aging at 130° C., as measured by ASTM D1925.

The polycarbonate compositions have a UL94 rating of V-2 or better, as measured following the procedure of Underwriter's Laboratory Bulletin 94 entitled "Tests for Flammability of Plastic Materials for Parts in Devices and Appliances" (ISBN 0-7629-0082-2), Fifth Edition, Dated Oct. 29, 1996, incorporating revisions through and including Dec. 12, 2003. For example, the polycarbonate compositions have a UL94 rating of V-2 or better at a thickness of 0.5 mm, 0.75 mm, 0.9 mm, 1.0 mm, 2.0 mm, or 3.0 mm. Alternatively, or in addition, the polycarbonate compositions have a UL94 rating of V-0 or better at a thickness of 0.5 mm, 0.75 mm, 0.9 mm, 1.0 mm, 2.0 mm, or 3.0 mm.

The polycarbonate compositions can have higher reliability, where the luminous flux and color coordinates shift is minor and allows greater lumen maintenance. Lumen maintenance can be evaluated according to IES LM-80-08 method, IES TM-21, IESNA methods or any other type of method used to determine lifetime of a solid state lighting product, but not limited to these methods.

The polycarbonate compositions have excellent physical properties. For example, the polycarbonate compositions can be formulated to have a melt volume flow rate suitable for the manufacture of small articles. Melt volume flow rate (often abbreviated "MVR") measures the rate of extrusion of a polymer through an orifice at a prescribed temperature and load. The polycarbonate compositions can have an MVR, measured at 300° C. under a load of 1.2 kg, of 0.1 to 200 cubic centimeters per 10 minutes (cc/10 min), specifically 1 to 100 cc/10 min. Specifically, the polycarbonate compositions can have a melt viscosity of less than 20 cc/10 min, less than 19 cc/10 min, less than 18 cc/10 min, less than 17 cc/10 min, less than 16 cc/10 min, less than 15 cc/10 min, or less than 12 cc/10 min, measured at 300° C./1.2 Kg at 360 second dwell measured according to ASTM D 1238.

The bisphenol A polycarbonates can have an intrinsic viscosity, as determined in chloroform at 25° C., of 0.3 to 1.5 deciliters per gram (dl/gm), specifically 0.45 to 1.0 dl/gm. The bisphenol A polycarbonates can have a weight average molecular weight of 10,000 to 200,000 Daltons, specifically 20,000 to 100,000 Daltons, as measured by gel permeation chromatography (GPC), using a crosslinked styrene-divinyl-benzene column and calibrated to polycarbonate references. GPC samples are prepared at a concentration of 1 mg per ml, and are eluted at a flow rate of 1.5 ml per minute.

The polycarbonate compositions can further have a heat deflection temperature (HDT) of 90° C. or more, more specifically 90 to 180° C., measured on one-eighth inch (3.18 mm) bars according to ASTM D648.

An article molded from the polycarbonate compositions can have a notched Izod impact of greater than 500 J/m as measured according to ASTM D 256-10 at a 0.125 inch (3.2 mm) thickness. In some embodiments the articles have 80% or 100% ductility.

Shaped, formed, or molded LED lighting device components comprising the polycarbonate compositions are also provided. The polycarbonate compositions can be molded into useful shapes by a variety of means such as injection molding, extrusion, rotational molding, blow molding and thermoforming to form components for LED devices, and in particular LED lighting devices. LED lighting devices include, for example, a lens, a bulb, a housing, a tube, a reflector, a wave guide (e.g., a light guide), a light diffuser, and the like. The LED device component can be transparent to light from the light source, or can comprise a diffusing particle or a diffusing surface to help mix the light as it passes through the housing. Optionally, portions of the device component can be diffusive, while other portions can be transparent or clear. A variety of shapes can be formed, including those described above in connection with compositions containing a conversion material. The thickness of a cross-section of the device components can vary widely depending on the particular application, for example from 0.1 mm to 100 mm or greater. The polycarbonate compositions are especially useful for device components having a thinner cross-sectional thickness, for example from 0.1 to 10 mm, 0.1 to 5 mm, 0.1 to 3 mm, or 0.1 to 1 mm Since the polycarbonate compositions of this disclosure have excellent heat aging profile, the LED component containing these compositions have an extended life span.

This disclosure also provides LED lighting devices. The devices comprise a light emitting diode and a device component, wherein the device component comprises the polycarbonate compositions described above. As used herein, the LED also includes organic light emitting diode. Since the LED component containing the polycarbonate of the disclosure is durable, the LED devices have extended lifetime, and can be employed in aviation lighting, automotive lighting, (e.g., brake lamps, turn signals, headlamps, cabin lighting, and indicators), traffic signals, text and video displays and sensors, a backlight of the liquid crystal display device, control units of various products (e.g., for televisions, DVD players, radios, and other domestic appliances), and a dimmable solid state lighting device. Under normal use, the LED devices can have an increased life span.

This disclosure also provides a process to reduce photodegradation of a component of a device exposed to light comprising a blue component having a wavelength of 400 nm to 500 nm and a UV component having a wavelength of 10 nm to 400 nm, e.g., light from a light-emitting diode, the process comprising molding any of the polycarbonate compositions described above to form the component of the device, wherein the polycarbonate composition comprises a bisphenol A polycarbonate and a UV absorber such as 2,2'-(1,4-phenylene)bis(4H-3,1-benzoxazin-4-one) in an amount effective to provide a polycarbonate composition wherein a molded sample of the composition has a UL94 rating of V-2 or better at a thickness of 0.9 mm; an absorbance of less than 2 a.u. in the region of 370 to 380 nanometers; and for a sample having a thickness of 2.5 mm, an increase in yellowness index ($\Delta YI$) of 12 or less after heat aging at 130° C. for 5,000 hours, as measured by ASTM D1925; and exposing the component of the device to a light emitting diode excitation/transmission source for a selected period of time, for example 1,000, 2,000, 3,000, 4,0000, or 5,0000 hours.

In another embodiment, a process to decrease light absorption in the range of 370 to 380 nanometers of a component of a device exposed to light comprising a component having a wavelength of 400 nm to 500 nm and a component having a wavelength of 10 nm to 400 nm, e.g., light from a light-emitting diode, comprises molding any of the polycarbonate compositions described above to form the component of the device, wherein the polycarbonate composition comprises a bisphenol A polycarbonate and an ultraviolet light absorber in an amount effective to provide a composition wherein a molded sample of the composition has a UL94 rating of V-2 or better at a thickness of 0.9 mm, an absorbance of less than 2 a.u. in the region of 370 to 380 nanometers; and for a sample having a thickness of 2.5 mm, an increase in yellowness index ($\Delta YI$) of 12 or less after heat aging at 130° C. for 5,000 hours, as measured by ASTM D1925; and exposing the component of the device to a light emitting diode excitation/transmission source for a selected period of time, for example 1,000, 2,000, 3,000, 4,0000, or 5,0000 hours.

The various embodiments are further illustrated by the following non-limiting examples.

EXAMPLES

Materials

Materials for the following examples are listed in Table 1.

TABLE 1

| Component | Description | Source |
|---|---|---|
| Cyasorb* UV3638 | 2,2'-(1,4-phenylene)bis(4H-3,1-benzoxazin-4-one) | CYTEC Industries |
| Cyasorb* UV5411 | 2-(2H-benzotriazol-2-yl)-4-(1,1,3,3-tetramethylbutyl)-phenol | CYTEC Industries |
| PC1 | Polycarbonate made from BPA with greater than 99.65% purity and less than 2 ppm sulfur | SABIC INNOVATIVE PLASTICS |
| PC2 | Polycarbonate made from BPA with less than 99.65% purity BPA | SABIC INNOVATIVE PLASTICS |

Extrusion and Molding Conditions.

Extrusions were performed either on a single screw extruder or a twin-screw extruder.

The compositions prepared with a single screw extruder were made as follows. All ingredients were dry blended for about 4 minutes using a paint shaker. The single screw extruder was a Sterling 1¾ inch (44.5 mm) extruder (Length/Diameter (L/D) ratio=24/1, with a vacuum port located near die face, with barrel and die temperature set points of 270, 275, 288, 288° C.).

The compositions prepared on the 30 mm WP twin screw 50 mm Mega extruder were made as follows. All ingredients were dry blended for about 4 minutes using a paint shaker or a drum tumbler. The twin-screw extruder contained a vacuum port located near die face. Typically, the compositions were compounded with an applied vacuum of 20+ inches of Hg.

The compositions prepared on a W&P 50 mm Mega twin screw were made as follows. All additives (stabilizers and/or colorants) were dry blended off-line as concentrates using one of the primary polymer powders as a carrier and starve-fed via gravimetric feeder into the feed throat of the extruder. The remaining polymer was starve-fed via gravimetric feeder into the feed throat of the extruder as well. The compositions were compounded with an applied vacuum of 20+ inches of Hg. The extruder was a nine-barrel machine (approx. Length/Diameter (L/D) ratio=36:1) with a vacuum port located in barrel 7.

The compositions were molded after drying at 121° C. for 4 hrs on a 260-ton (236 metric ton) Van Dorn or an 85 Ton Van Dorn molding machine operating at about 300 to 320° C. with a mold temperature of about 80° C. It will be recognized by one skilled in the art that the method is not limited to these temperatures or processing equipment.

Testing Methods.

Standard ASTM testing was performed at 50% relative humidity (RH) and unless otherwise indicated at room temperature (RT). All ASTM tests are dated 2000 unless indicated otherwise.

The reported transmission data (% T) was measured at the indicated thickness on a Gretagmacbeth Color-Eye 7000A (Propalette Optiview Gold version 5.2.1.7) using the color space CIE1931 (Illuminant C and a 2° observer) and is equivalent to the "Y" tristimulus value according to ASTM-D1003-00.

The reported haze data was measured using 3.18 or 2.5 mm thick plaques according to ASTM-D1003-00.

The reported yellowness Index (YI) data was measured at the indicated thickness on a Gretagmacbeth Color-Eye 7000A (Propalette Optiview Gold version 5.2.1.7) in accordance with ASTM E313-73 (D1925) using Illuminant C and a 2° observer.

Heat aging was done by placing 2.5 mm thick color plaques in an oven at 130° C. Color was measured at regular intervals over a period of 3,000 or 5,000 hours (hrs) via a MacBeth 7000A.

Accelerated weathering was performed using xenon arc according to ISO11431 on 2.5 mm plaques. Color was measured at regular intervals over a period of 3,000 or 5,000 hours (hrs) via a MacBeth 7000A.

Example 1

Figure 2:
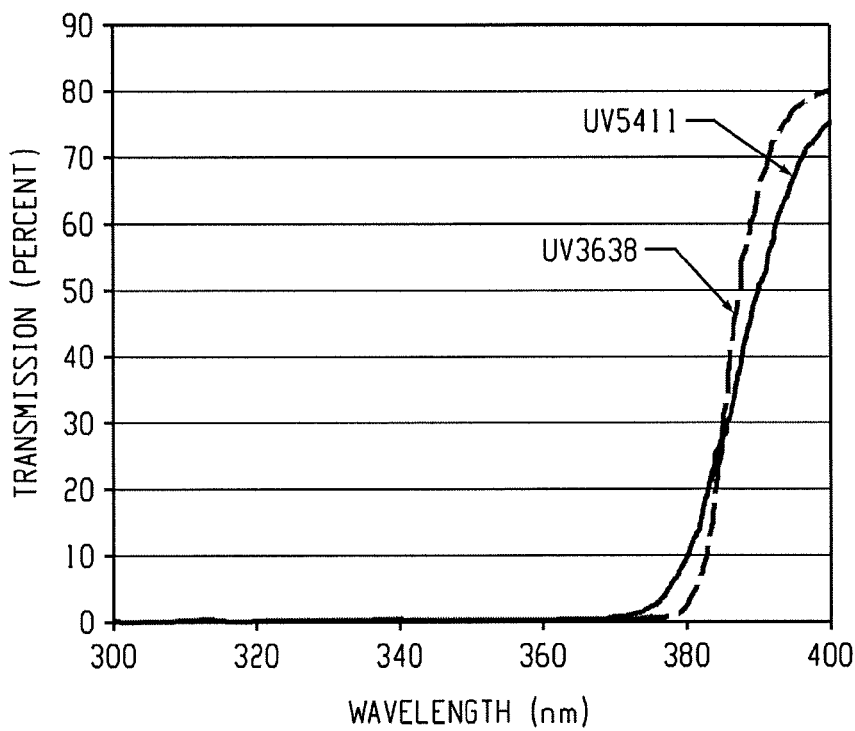
FIG. 2 is a graph illustrating the transmission difference between polycarbonate samples containing UV5411 and UV3638.

This example demonstrates that UV3638-containing polycarbonate compositions can have the same UV performance as UV5411-containing polycarbonate compositions, while at the same time, UV-3638 containing polycarbonate compositions absorb less light having a wavelength above about 370 nm. FIGS. 1 and 2 show data for compositions within the ranges shown in Table 2.

TABLE 2

| Component (wt %) | UV5411 PC1 | UV3638 PC1 |
|---|---|---|
| PC1 | 97.3-99.97 | 97.3-99.97 |
| PC2 | | |
| Stabilizer/antioxidant | 0.01-0.2 | 0.01-0.2 |
| Mold release agent | 0.01-0.2 | 0.01-0.2 |
| Flame retardant package | 0-2.0 | 0-2.0 |
| UV5411 (wt %) | 0.01-0.3 | |
| UV3638 (wt %) | | 0.01-0.3 |

Absorbance and transmission of UV5411- and UV3638-containing polycarbonate compositions are illustrated in FIGS. 1 and 2. FIG. 1 shows that the UV5411-containing polycarbonate compositions has higher absorbance when the excitation source is greater than 370 nm as compared to the UV3638-containing polycarbonate composition. FIG. 2 shows that below 370 nm no UV light is transmitted for either the UV3638-containing or UV5411-containing polycarbonate compositions.

Example 2

The optical performances of various UV5411- and UV3638-containing polycarbonate compositions before and after weathering are compared. The test results are presented in FIGS. 3, 4, 5, and 6, which show data for compositions within the ranges shown in Table 3.

TABLE 3

| Component (wt %) | UV5411 PC1 | UV5411 PC2 | UV3638 PC1 | UV3638 PC2 |
|---|---|---|---|---|
| PC1 | 97.3-99.97 | | 97.3-99.97 | |
| PC2 | | 97.3-99.97 | | 97.3 99.97 |
| Stabilizer/antioxidant | 0.01-0.2 | 0.01-0.2 | 0.01-0.2 | 0.01-0.2 |
| Mold release agent | 0.01-0.2 | 0.01-0.2 | 0.01-0.2 | 0.01-0.2 |
| Flame retardant package | 0-2.0 | 0-2.0 | 0-2.0 | 0-2.0 |
| UV5411 | 0.01-0.3 | 0.01-0.3 | | |
| UV3638 | | | 0.01-0.3 | 0.01-0.3 |

Figure 3:
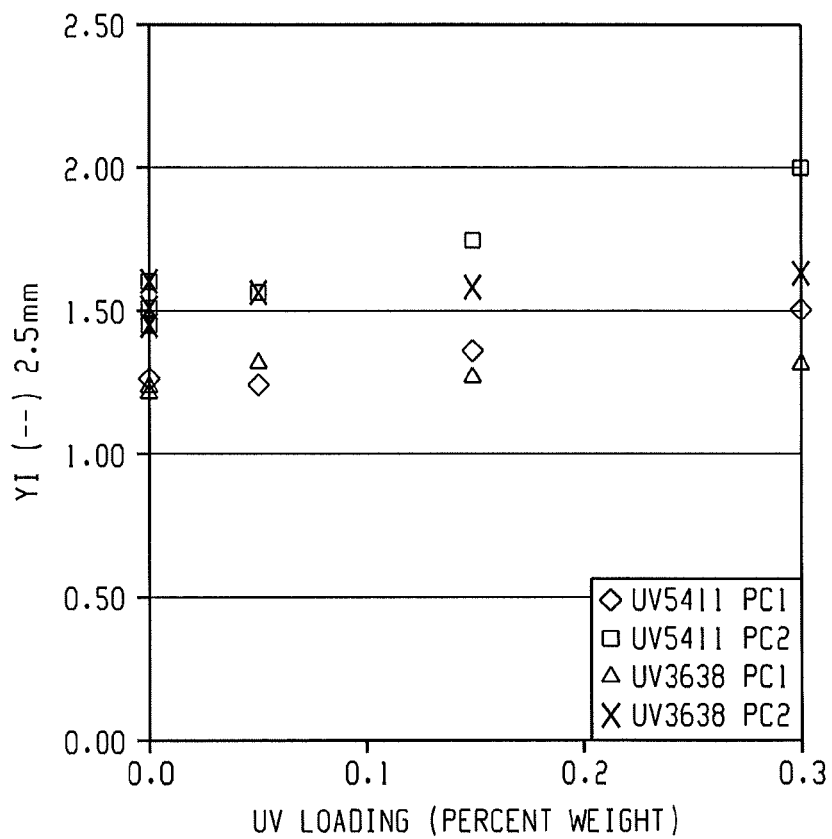
FIG. 3 is a graph illustrating the yellowness index (YI) of various polycarbonate compositions comprising UV5411 and UV3638 as a function of UV absorber loading level.

FIG. 3 shows that before weathering, above about 0.25 wt. %, the UV3638-containing polycarbonate composition based on PC1 is less yellow than the same UV5411-containing polycarbonate compositions. The trend is similar in compositions based on PC-2. In those compositions, above about 0.13 wt. %, the UV3638-containing polycarbonate composition based on PC2 is less yellow than the same UV5411-containing polycarbonate composition. Furthermore, higher loading of UV5411 results in higher YI. Higher loading of UV3638, on the other hand, results in a much smaller increase in YI, particularly for PC2.

Figure 4:
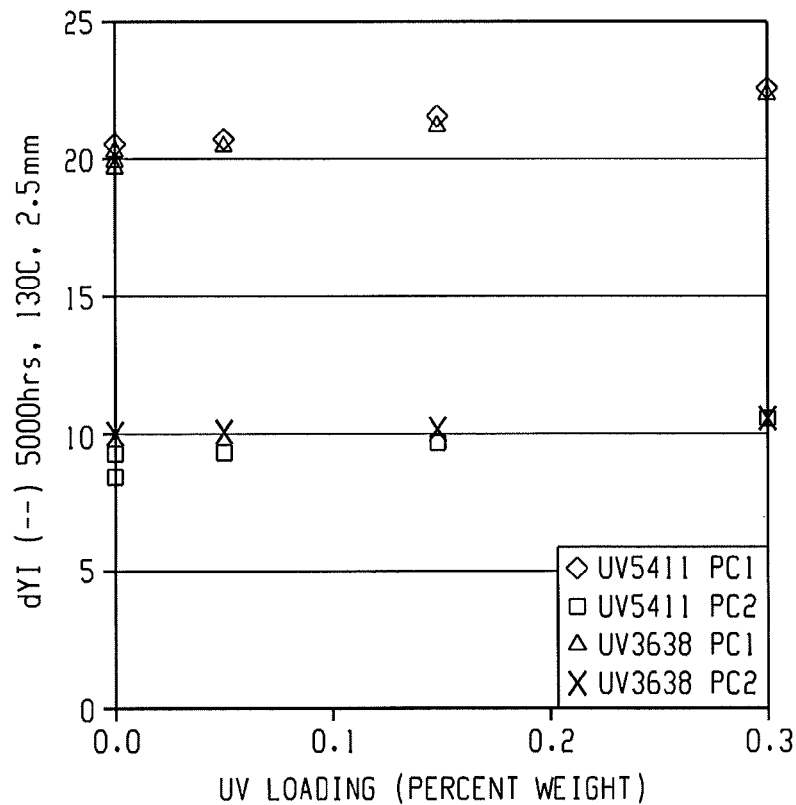
FIG. 4 is a graph illustrating the change of yellowness index (YI) of various polycarbonate compositions comprising UV5411 and UV3638 after 5,000 hours of aging at 130° C. as a function of UV absorber loading level.

FIG. 4 shows the change in the yellowness index (ΔYI) of the UV5411- and UV3638-containing polycarbonate compositions after 5,000 hours of heat aging at 130° C. As can be seen from the data, the ΔYI of both of the UV3638-containing polycarbonate compositions (ΔYI=12 or less) is less than the ΔYI of both of the UV5411-containing polycarbonate compositions (ΔYI=18 or more).

Figure 5:
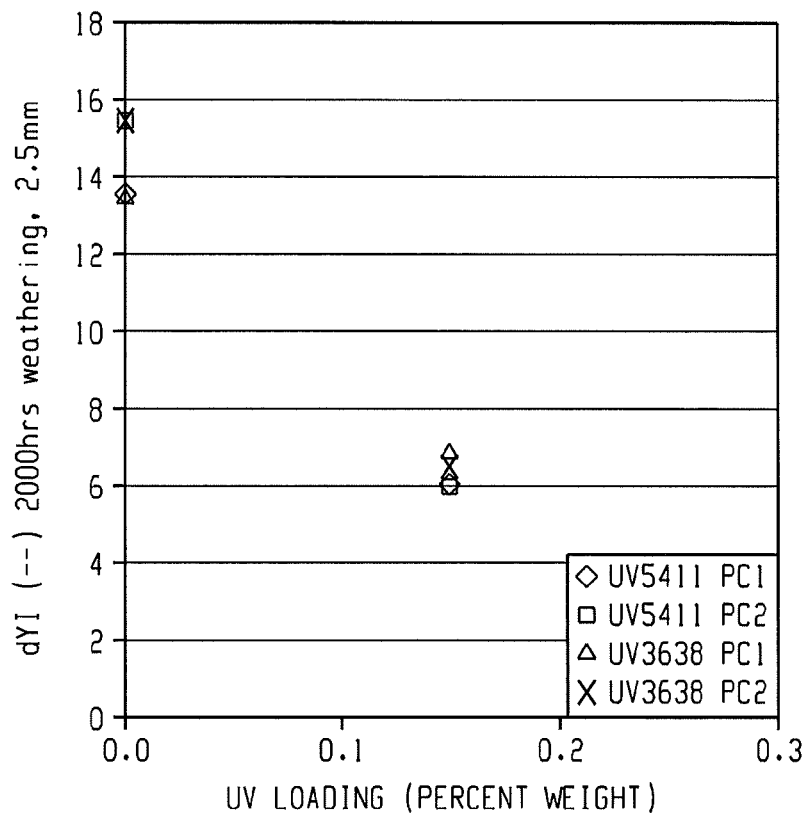
FIG. 5 is a graph illustrating the change of yellowness index (YI) of various polycarbonate compositions comprising UV5411 and UV3638 after 2,000 hours of weathering as a function of UV absorber loading level.

FIG. 5 shows that the ΔYI of both of the UV3638-containing polycarbonate compositions after 2,000 hours of accelerated weathering is approximately the same as that of both of the UV5411-containing polycarbonate compositions. The ΔYI decreases with an increased amount of UV3638 or UV5411.

Figure 6:
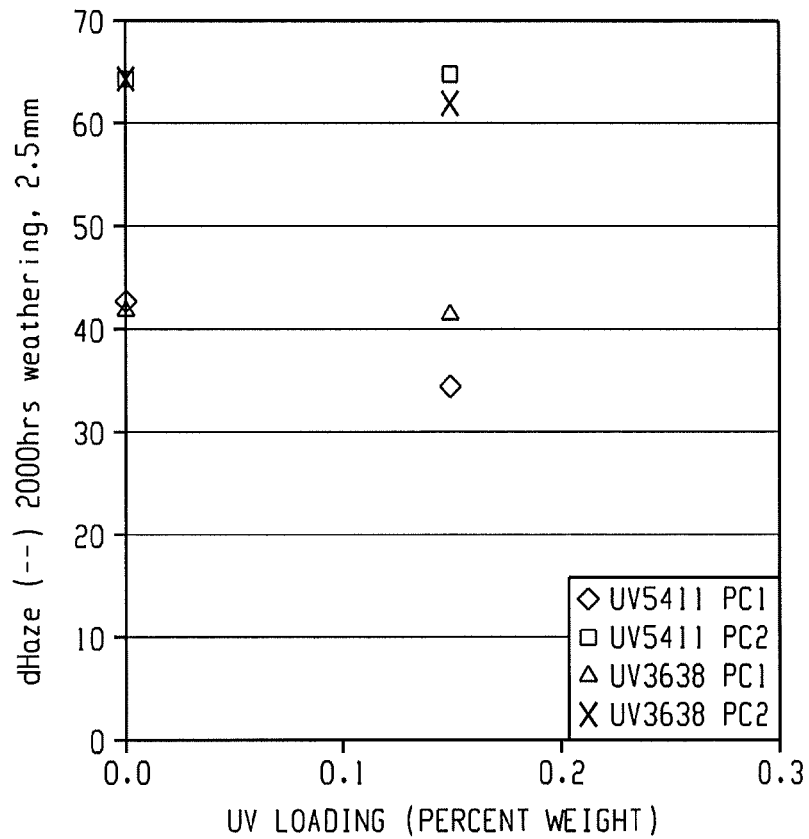
FIG. 6 is a graph illustrating the change of haze of various polycarbonate compositions comprising UV5411 and UV3638 after 2,000 hours of weathering as a function of UV absorber loading level.

FIG. 6 shows the change in haze (Δhaze) of UV5411- and UV3638-containing polycarbonate compositions after 2,000 hours of accelerated weathering. Here, the results show that the Δhaze for PC1-based compositions is significantly less than that of PC2-based compositions.

The singular forms "a," "an," and "the" include plural referents unless the context clearly dictates otherwise. "Or" means "and/or." The endpoints of all ranges directed to the same component or property are inclusive and independently combinable. "Optional" or "optionally" means that the subsequently described event or circumstance can or cannot occur, and that the description includes instances where the event occurs and instances where it does not. Unless defined otherwise, technical and scientific terms used herein have the same meaning as is commonly understood by one of skill in the art to which this invention belongs.

As used herein, a "combination" is inclusive of blends, mixtures, alloys, reaction products, and the like. Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, —CHO is attached through carbon of the carbonyl group.

As used herein, the term "hydrocarbyl" and "hydrocarbon" refers broadly to a substituent comprising carbon and hydrogen, optionally with 1 to 3 heteroatoms, for example, oxygen, nitrogen, halogen, silicon, sulfur, or a combination thereof; "alkyl" refers to a straight or branched chain, saturated monovalent hydrocarbon group; "alkylene" refers to a straight or branched chain, saturated, divalent hydrocarbon group; "alkylidene" refers to a straight or branched chain, saturated divalent hydrocarbon group, with both valences on a single common carbon atom; "alkenyl" refers to a straight or branched chain monovalent hydrocarbon group having at least two carbons joined by a carbon-carbon double bond; "cycloalkyl" refers to a non-aromatic monovalent monocyclic or multicylic hydrocarbon group having at least three carbon atoms, "cycloalkenyl" refers to a non-aromatic cyclic divalent hydrocarbon group having at least three carbon atoms, with at least one degree of unsaturation; "aryl" refers to an aromatic monovalent group containing only carbon in the aromatic ring or rings; "arylene" refers to an aromatic divalent group containing only carbon in the aromatic ring or rings; "alkylaryl" refers to an aryl group that has been substituted with an alkyl group as defined above, with 4-methylphenyl being an exemplary alkylaryl group; "arylalkyl" refers to an alkyl group that has been substituted with an aryl group as defined above, with benzyl being an exemplary arylalkyl group; "acyl" refers to an alkyl group as defined above with the indicated number of carbon atoms attached through a carbonyl carbon bridge (—C(=O)—); "alkoxy" refers to an alkyl group as defined above with the indicated number of carbon atoms attached through an oxygen bridge (—O—); and "aryloxy" refers to an aryl group as defined above with the indicated number of carbon atoms attached through an oxygen bridge (—O—).

Unless otherwise indicated, each of the foregoing groups can be unsubstituted or substituted, provided that the substitution does not significantly adversely affect synthesis, stability, or use of the compound. The term "substituted" as used herein means that at least one hydrogen on the designated atom or group is replaced with another group, provided that the designated atom's normal valence is not exceeded. When the substituent is oxo (i.e., =O), then two hydrogens on the atom are replaced. Combinations of substituents and/or variables are permissible provided that the substitutions do not significantly adversely affect synthesis or use of the compound. Exemplary groups that can be present on a "substituted" position include, but are not limited to, cyano; hydroxyl; nitro; azido; alkanoyl (such as a $C_{2-6}$ alkanoyl group such as acyl); carboxamido; $C_{1-6}$ or $C_{1-3}$ alkyl, cycloalkyl, alkenyl, and alkynyl (including groups having at least one unsaturated linkages and from 2 to 8, or 2 to 6 carbon atoms); $C_{1-6}$ or $C_{1-3}$ alkoxy groups; $C_{6-10}$ aryloxy such as phenoxy; $C_{1-6}$ alkylthio; $C_{1-6}$ or $C_{1-3}$ alkylsulfinyl; C1-6 or $C_{1-3}$ alkylsulfonyl; aminodi($C_{1-6}$ or $C_{1-3}$)alkyl; $C_{6-12}$ aryl having at least one aromatic rings (e.g., phenyl, biphenyl, naphthyl, or the like, each ring either substituted or unsubstituted aromatic); $C_{7-19}$ alkylenearyl having 1 to 3 separate or fused rings and from 6 to 18 ring carbon atoms, with benzyl being an exemplary arylalkyl group; or arylalkoxy having 1 to 3 separate or fused rings and from 6 to 18 ring carbon atoms, with benzyloxy being an exemplary arylalkoxy group.

All references cited herein are incorporated by reference in their entirety. While typical embodiments have been set forth for the purpose of illustration, the foregoing descriptions should not be deemed to be a limitation on the scope herein. Accordingly, various modifications, adaptations, and alternatives can occur to one skilled in the art without departing from the spirit and scope herein.

What is claimed is:

1. A light emitting diode device comprising
   a light emitting diode, and
   a device component, wherein the device component comprises a polycarbonate composition comprising
      a bisphenol A polycarbonate; and
      2,2'-(1,4-phenylene)bis(4H-3,1-benzoxazin-4-one) in an amount effective to provide a composition wherein a molded sample of the composition has a UL94 rating of V-2 or better at a thickness of 0.9 mm;
      an absorbance of less than 2 a.u. in the region of 370 to 380 nanometers; and
      for a molded sample of the composition having a thickness of 2.5 mm, an increase in yellowness index (ΔYI) of 12 or less after heat aging at 130° C. for 5,000, as measured by ASTM D1925,
   wherein the bisphenol A polycarbonate comprises less than or equal to 150 ppm free hydroxyl groups and less than or equal to 2 ppm sulfur as measured by a Total Sulfur Analysis based on combustion and coulometric detection, and a molded sample of the bisphenol A polycarbonate has: a yellowness index of 1.5 or less measured by ASTM D1925, and an increase in yellowness index of less than 3 after 2,000 hours of heat aging at 130° C. as measured by ASTM D 1925.

2. The light emitting diode device of claim 1, wherein the device is a lighting device.

3. The device of claim 1, wherein the bisphenol A polycarbonate is an interfacially polymerized polycarbonate.

4. The device of claim 1, wherein the bisphenol A polycarbonate is an interfacially polymerized polycarbonate manufactured from bisphenol A having a purity of greater than or equal to 99.65 wt. % and a sulfur content of less than or equal to 2 ppm.

5. The device of claim 1, wherein the bisphenol A polycarbonate is a melt polymerized polycarbonate.

6. The device of claim 1, wherein the bisphenol A polycarbonate comprises a linear bisphenol A polycarbonate.

7. The device of claim 1, wherein the bisphenol A polycarbonate comprises a branched bisphenol A polycarbonate having a branching level of greater than or equal to 0.35 wt. %.

8. The device of claim 1, wherein the bisphenol A polycarbonate comprises a linear bisphenol A polycarbonate and a branched bisphenol A polycarbonate.

9. The device of claim 1, wherein the polycarbonate composition further comprises an additional polycarbonate derived from a bisphenol, wherein the additional polycarbonate is different from the bisphenol A polycarbonate.

10. The device of claim 9, wherein the additional polycarbonate is a homopolycarbonate derived from a bisphenol that is not bisphenol A, a copolycarbonate derived from more than one bisphenol, a copolymer derived from a bisphenol and comprising an aliphatic ester unit, or an aromatic ester unit, a siloxane unit or a combination comprising at least one of the foregoing units, or a combination comprising at least one of the foregoing polycarbonates.

11. The device of claim 1, wherein the polycarbonate composition further comprises a light diffuser.

12. The device of claim 11, wherein the light diffuser comprises crosslinked poly(methyl methacrylate), poly(tetrafluoroethylene), poly(methylsilsesquioxane), or a combination comprising at least one of the foregoing.

13. The device of claim 1, wherein the polycarbonate composition further comprises potassium perfluorobutane sulfonate, potassium perfluorooctane sulfonate, tetraethylammonium perfluorohexane sulfonate, potassium diphenylsulfone sulfonate, or a combination comprising at least one of the foregoing.

14. The device of claim 1, wherein the polycarbonate composition further comprises a conversion material.

15. The device of claim 14, wherein the conversion material is a strontium silicate yellow conversion material, a yttrium aluminum garnet doped with a rare earth element, a terbium aluminum garnet doped with a rare earth element, a silicate conversion material, a nitride conversion material, a nitrido silicate conversion material, a nitride orthosilicate conversion material, an oxonitridoaluminosilicates conversion material, or a combination comprising at least one of the foregoing conversion materials.

16. The device of claim 14, wherein the conversion material comprises a silicone oil coating or an amorphous silica coating.

17. The device of claim 1, wherein the polycarbonate composition comprises less than 10 ppm of an ultraviolet light absorbing agent having a hydroxyl group.

18. The device of claim 1, wherein the polycarbonate composition contains less than 10 ppm of 2-(2H-benzotriazol-2-yl)-4-(1,1,3,3-tetramethylbutyl)-phenol.

19. The device of claim 1, wherein the polycarbonate composition does not contain 2-(2H-benzotriazol-2-yl)-4-(1,1,3,3-tetramethylbutyl)-phenol.

20. The device of claim 1, wherein the polycarbonate composition contains less than 1000 ppm of an additive having a hydroxyl group.

21. The device of claim 1, wherein the polycarbonate composition comprises 0.2 to 1 wt. % of the 2,2'-(1,4-phenylene)bis(4H-3,1-benzoxazin-4-one), based on the total weight of the polycarbonate composition.

22. The device of claim 1, wherein the polycarbonate composition comprises:
90 to 99.9 wt. % of the bisphenol A polycarbonate,
0.001 to 1 wt. % of the 2,2'-(1,4-phenylene)bis(4H-3,1-benzoxazin-4-one),
0.0001 to 1 wt. % of a thermal stabilizing additive,
0.0001 to 1 wt. % of an antioxidant,
0.001 to 1 wt. % of a mold release agent,
a flame retardant comprising a phosphorus-containing flame retardant, a halogen-containing flame retardant, an inorganic flame retardant, or a combination comprising at least one of the foregoing flame retardant, the flame retardant being present in an amount of 0.01 to 10 parts by weight based on 100 parts by weight of the polycarbonate composition,
0 to 1 wt. % of a colorant,
0 to 1% of a gamma-stabilizing agent,
0 to 10% of a filler,
0 to 20 wt. % of a conversion material,
0 to 1.5 wt. % of a light diffuser, or a combination comprising at least one of the foregoing optional materials.

23. The device of claim 22, comprising 0.001 to 1.5 wt. % of a light diffuser, wherein the light diffuser is a poly(alkyl acrylate), a poly(alkyl methacrylate), a poly(alkylsilsequioxane), a poly(tetrafluoroethylene), or a combination comprising at least one of the foregoing.

24. The device of claim 22, wherein no light diffuser is present and a molded article of the polycarbonate composition has transmission level greater than or equal to 90% at 2.5 mm thickness as measured by ASTM D1003-00.

25. The device of claim 1, wherein the polycarbonate composition comprises:
95 to 99.8 wt. % of the bisphenol A homopolycarbonate,
0.001 to 0.5 wt. % of the 2,2'-(1,4-phenylene)bis(4H-3,1-benzoxazin-4-one),
0.0001 to 1 wt. % of a thermal stabilizing additive,
0.0001 to 1 wt. % of an antioxidant,
0.001 to 1 wt. % of a mold release agent,
a flame retardant, wherein the flame retardant is potassium perfluorobutane sulfonate, potassium diphenylsulfone sulfonate, or a combination comprising at least one of the foregoing flame retardants, and the flame retardant is present in an amount of 0.01 to 10 parts by weight based on 100 parts by weight of the polycarbonate composition,
0.001 to 1.5 wt. % of a light diffuser, wherein the light diffuser is a poly(alkyl acrylate), a poly(alkyl methacrylate), a poly(alkylsilsequioxane), a poly(tetrafluoroethylene), or a combination comprising at least one of the foregoing light diffusers,
0 to 1 wt. % of a colorant,
0 to 1% of a gamma-stabilizing agent,
0 to 10% of a filler,
0 to 20 wt. % of a conversion material, or a combination comprising at least one of the foregoing optional materials.

26. The device of claim 1, wherein the polycarbonate composition comprises:
95 to 99.8 wt. % of the bisphenol A homopolycarbonate,
0.001 to 0.5 wt. % of the 2,2'-(1,4-phenylene)bis(4H-3,1-benzoxazin-4-one),
0.0001 to 1 wt. % of a thermal stabilizing additive,
0.0001 to 1 wt. % of an antioxidant,
0.001 to 1 wt. % of a mold release agent,
a flame retardant, wherein the flame retardant is potassium perfluorobutane sulfonate, potassium diphenylsulfone sulfonate, or a combination comprising at least one of the foregoing flame retardants, and the flame retardant is present in an amount of 0.01 to 10 parts by weight based on 100 parts by weight of the polycarbonate composition
substantially no light diffuser,
0 to 1 wt. % of a colorant,
0 to 1% of a gamma-stabilizing agent,
0 to 10% of a filler,
0 to 20 wt. % of a conversion material, or a combination comprising at least one of the foregoing optional materials.

27. A process to reduce photodegradation of a component of a device exposed to light comprising a component having a wavelength of 400 nm to 500 nm and a component having a wavelength of 10 nm to 400 nm, the process comprising
molding a polycarbonate composition to form the component of the device, wherein the polycarbonate composition comprises
a bisphenol A polycarbonate, and
an ultraviolet light absorber in an amount effective to provide a composition wherein a molded sample of the composition has
a UL94 rating of V-2 or better at a thickness of 0.9 mm;
an absorbance of less than 2 a.u. in the region of 370 to 380 nanometers; and
for a molded sample of the composition having a thickness of 2.5 mm, an increase in yellowness index ($\Delta YI$) of 12 or less after heat aging at 130° C. for 5,000 hours, as measured by ASTM D1925; and
exposing the component of the device to a light emitting diode excitation/transmission source for a selected period of time,
wherein the bisphenol A polycarbonate comprises less than or equal to 150 ppm free hydroxyl groups and less than or equal to 2 ppm sulfur as measured by a Total Sulfur Analysis based on combustion and coulometric detection and a molded sample of the bisphenol A polycarbonate has: a yellowness index of 2.5 or less measured by ASTM D1925, and an increase in yellowness index of less than 3 after 2,000 hours of heat aging at 130° C. as measured by ASTM D 1925.

28. A process to decrease light absorption in the range of 370 to 380 nanometers of a component of a device exposed to light comprising a component having a wavelength of 400 nm to 500 nm and a component having a wavelength of 10 nm to 400 nm, the process comprising
molding a polycarbonate composition to form the component of the device, wherein the polycarbonate composition comprises
a bisphenol A polycarbonate, and
an ultraviolet light absorber in an amount effective to provide a composition wherein a molded sample of the composition has
a UL94 rating of V-2 or better at a thickness of 0.9 mm,
an absorbance of less than 2 a.u. in the region of 370 to 380 nanometers; and
for a molded sample of the composition having a thickness of 2.5 mm, an increase in yellowness index ($\Delta YI$) of 12 or less after heat aging at 130° C. for 5,000 hours, as measured by ASTM D1925; and
exposing the component of the device to a light emitting diode excitation/transmission source for a selected period of time,
wherein the bisphenol A polycarbonate comprises less than or equal to 150 ppm free hydroxyl groups and less than or equal to 2 ppm sulfur as measured by a Total Sulfur Analysis based on combustion and coulometric detection, and a molded sample of the bisphenol A polycarbonate has: a yellowness index of 2.5 or less measured by ASTM D1925, and an increase in yellowness index of less than 3 after 2,000 hours of heat aging at 130° C. as measured by ASTM D 1925.

29. The light emitting diode device of claim 1, wherein the device component is free of titanium dioxide.

30. The light emitting diode device of claim 1, wherein the polycarbonate composition further comprises a gamma-stabilizing agent.

31. A polycarbonate composition comprising a bisphenol A polycarbonate; and
2,2'-(1,4-phenylene)bis(4H-3,1-benzoxazin-4-one) in an amount effective to provide a composition, wherein a molded sample of the composition has:
a UL94 rating of V-2 or better at a thickness of 0.9 mm;
an absorbance of less than 2 a.u. in the region of 370 to 380 nanometers; and for a molded sample of the composition having a thickness of 2.5 mm, an increase in yellowness index ($\Delta YI$) of 12 or less after heat aging at 130° C. for 5,000, as measured by ASTM D1925;
wherein the bisphenol A polycarbonate comprises less than or equal to 150 ppm free hydroxyl groups and less than or equal to 2 ppm sulfur as measured by a Total Sulfur Analysis based on combustion and coulometric detection, and a molded sample of the bisphenol A polycarbonate has: a yellowness index of 1.5 or less measured by ASTM D1925, and an increase in yellowness index of less than 3 after 2,000 hours of heat aging at 130° C. as measured by ASTM D 1925.

32. The polycarbonate composition of claim 31, wherein the polycarbonate composition further comprises an additional polycarbonate derived from a bisphenol, wherein the additional polycarbonate is different from the bisphenol A polycarbonate.

33. The polycarbonate composition of claim 31, further comprising a light diffuser, a conversion material, a thermal stabilizing additive, an antioxidant, a mold release agent, a flame retardant, a colorant, a gamma-stabilizing agent, a filler, or a combination comprising at least one of the foregoing.

34. The polycarbonate composition of claim 31, wherein the polycarbonate composition comprises:
95 to 99.8 wt. % of the bisphenol A homopolycarbonate,
0.001 to 0.5 wt. % of the 2,2'-(1,4-phenylene)bis(4H-3,1-benzoxazin-4-one),
0.0001 to 1 wt. % of a thermal stabilizing additive,
0.0001 to 1 wt. % of an antioxidant,
0.001 to 1 wt. % of a mold release agent,
a flame retardant, wherein the flame retardant is potassium perfluorobutane sulfonate, potassium diphenylsulfone sulfonate, or a combination comprising at least one of the foregoing flame retardants, and the flame retardant is present in an amount of 0.01 to 10 parts by weight based on 100 parts by weight of the polycarbonate composition,
substantially no light diffuser,
0 to 1 wt. % of a colorant,
0 to 1% of a gamma-stabilizing agent,
0 to 10% of a filler,
0 to 20 wt. % of a conversion material, or a combination comprising at least one of the foregoing optional materials.

35. The polycarbonate composition of claim 31, wherein one or more of the following apply:
the polycarbonate composition has a heat deflection temperature of 90° C. or higher, measured on one-eight inch bars according to ASTM D648; or a sample of the polycarbonate composition has a notched Izod impact of greater than 500 J/m as measured according to ASTM D 256-10 at a 0.125 inch thickness.

* * * * *